(12) United States Patent
Omori et al.

(10) Patent No.: US 9,972,530 B2
(45) Date of Patent: May 15, 2018

(54) METHOD OF MANUFACTURING SEMICONDUCTOR DEVICE INCLUDING COPPER INTERCONNECTIONS

(71) Applicant: Renesas Electronics Corporation, Tokyo (JP)

(72) Inventors: Kazuyuki Omori, Kanagawa (JP); Seiji Muranaka, Kanagawa (JP); Kazuyoshi Maekawa, Kanagawa (JP)

(73) Assignee: Renesas Electronics Corporation, Tokyo ( * ) Notice: Subject to any disclaimer, the term of this patent is extended or adjusted under 35 U.S.C. 154(b) by 0 days. days.

(21) Appl. No.: 15/298,302

(22) Filed: Oct. 20, 2016

(65) Prior Publication Data

US 2017/0040212 A1 Feb. 9, 2017

Related U.S. Application Data

(62) Division of application No. 14/592,998, filed on Jan. 9, 2015, now Pat. No. 9,508,646.

(30) Foreign Application Priority Data

Jan. 31, 2014 (JP) ................................. 2014-016841

(51) Int. Cl.
*H01L 21/4763* (2006.01)
*H01L 21/44* (2006.01)
(Continued)

(52) U.S. Cl.
CPC .... *H01L 21/76843* (2013.01); *C23C 14/0641* (2013.01); *C23C 14/165* (2013.01);
(Continued)

(58) Field of Classification Search
CPC ......... H01L 21/76843; H01L 21/76807; H01L 21/76876; H01L 23/53228;
(Continued)

(56) References Cited

U.S. PATENT DOCUMENTS 7,145,241 B2 12/2006 Takayama et al.
8,004,087 B2 8/2011 Amano et al.
(Continued)

FOREIGN PATENT DOCUMENTS

JP 2000-195949 A 7/2000
JP 2004-207281 A 7/2004
(Continued)

OTHER PUBLICATIONS

Office Action dated Jul. 25, 2017, in Japanese Patent Application No. 2014-016841.

*Primary Examiner* — Kimberly Rizkallah
*Assistant Examiner* — Dilinh Nguyen
(74) *Attorney, Agent, or Firm* — Shapiro, Gabor and Rosenberger, PLLC

(57) ABSTRACT

Performance of a semiconductor device is improved. In one embodiment, for example, deposition time is increased from 4.6 sec to 6.9 sec. In other words, in one embodiment, thickness of a tantalum nitride film is increased by increasing the deposition time. Specifically, in one embodiment, deposition time is increased such that a tantalum nitride film provided on the bottom of a connection hole to be coupled to a wide interconnection has a thickness within a range from 5 to 10 nm.

13 Claims, 17 Drawing Sheets

(51) Int. Cl.
*H01L 21/768* (2006.01)
*H01L 23/528* (2006.01)
*H01L 23/532* (2006.01)
*C23C 14/34* (2006.01)
*H01L 21/285* (2006.01)
*C23C 14/06* (2006.01)
*C23C 14/16* (2006.01)

(52) U.S. Cl.
CPC .......... *C23C 14/34* (2013.01); *H01L 21/2855* (2013.01); *H01L 21/7684* (2013.01); *H01L 21/76802* (2013.01); *H01L 21/76807* (2013.01); *H01L 21/76846* (2013.01); *H01L 21/76876* (2013.01); *H01L 21/76879* (2013.01); *H01L 21/76897* (2013.01); *H01L 23/528* (2013.01); *H01L 23/5283* (2013.01); *H01L 23/53228* (2013.01); *H01L 23/53238* (2013.01); *H01L 23/53266* (2013.01); *H01L 23/53295* (2013.01); *H01L 2924/0002* (2013.01)

(58) Field of Classification Search
CPC .......... H01L 23/53266; H01L 21/2855; H01L 23/53295; H01L 23/5283; H01L 23/528; H01L 21/76897; H01L 21/76846; H01L 23/53238; H01L 21/7684; H01L 21/76802; H01L 21/76879; H01L 2924/0002
USPC ....... 438/627, 643, 653, 927, 629, 637, 639, 438/640, 667, 668, 672, 675, 700–701, 438/713, 798; 257/751, 774
See application file for complete search history.

(56) References Cited

U.S. PATENT DOCUMENTS

| 8,029,873 | B2 | 10/2011 | Ikeda et al. |
| 2007/0020829 | A1 | 1/2007 | Hotta et al. |
| 2009/0200670 | A1* | 8/2009 | Sunayama .......... H01L 21/2855 257/751 |
| 2011/0057317 | A1 | 3/2011 | Koike et al. |
| 2013/0207193 | A1* | 8/2013 | Haneda ................. H01L 27/088 257/365 |

FOREIGN PATENT DOCUMENTS

| JP | 2007-043038 A | 2/2007 |
| JP | 2009-038248 A | 2/2009 |
| WO | WO 2006/016678 A1 | 2/2006 |

* cited by examiner

| DEPOSITION CONDITION | | RELATED-ART CONDITION | CONDITION OF EMBODIMENT |
|---|---|---|---|
| TaN | TARGET DC POWER | 20kW | 20kW |
| | SUBSTRATE DRAW BIAS | 650W | 650W |
| | DEPOSITION TIME | 4.6 sec | 6.9 sec (1.2 to 1.5 times) |

| DEPOSITION CONDITION | | RELATED-ART CONDITION | CONDITION OF EMBODIMENT |
|---|---|---|---|
| Ta | TARGET DC POWER | 20kW | 20kW |
| | SUBSTRATE DRAW BIAS | 250W | 400V |
| | POTENTIAL OF SEMICONDUCTOR SUBSTRATE | −255V | −350V |

METHOD OF MANUFACTURING SEMICONDUCTOR DEVICE INCLUDING COPPER INTERCONNECTIONS

CROSS-REFERENCE TO RELATED APPLICATIONS

The disclosure of Japanese Patent Application No. 2014-016841 filed on Jan. 31, 2014 including the specification, drawings and abstract is incorporated herein by reference in its entirety.

BACKGROUND

The present invention relates to a semiconductor device and a technique for manufacturing the semiconductor device, for example, relates to a technology that is effectively applied to a semiconductor device including a copper interconnection and a technique for manufacturing the semiconductor device.

International Publication WO 2006/016678 describes a semiconductor device in which a first copper interconnection and a second copper interconnection having different line widths are provided in the same interconnection layer.

SUMMARY

For example, a semiconductor device may include a copper interconnection including copper as a main component, in which a wide interconnection (first copper interconnection) and a narrow interconnection (second copper interconnection) having different line widths may be provided in the same interconnection layer. Specifically, for example, the wide interconnection is used as a power line for supplying power supply potential, and the narrow interconnection is used as a signal line for transmitting a signal.

The wide interconnection and the narrow interconnection are formed in the same interconnection layer in one step by "damascene process", for example. For example, the narrow interconnection is a fine interconnection formed in minimum working size, and a barrier conductor film included in the narrow interconnection is necessary to have a small thickness in order to secure filling properties of a film in the damascene process. Hence, since the wide interconnection formed in the same layer as the narrow interconnection is formed in the same step as the narrow interconnection, a barrier conductor film included in the wide interconnection necessarily has a small thickness.

For example, when attention is focused on "dual damascene process" in which a copper interconnection and a plug are formed together, a barrier conductor film is formed on the bottom of the plug formed together with the copper interconnection. Consequently, when the barrier conductor film is formed to have a small thickness on ground of the filling properties of the narrow interconnection formed in minimum working size, a barrier conductor film formed on the bottom of a plug, which is arranged in an underlayer of the narrow interconnection and to be coupled to the narrow interconnection, also has a small thickness, and a barrier conductor film formed on the bottom of a plug, which is arranged in an underlayer of the wide interconnection and to be coupled to the wide interconnection, also has a small thickness.

In this configuration, a barrier conductor film is interposed between the plug and the lower interconnection. As a result of investigation by the inventors, it is found that the resistance value of the plug increases with increase in thickness of the barrier conductor film. Since the wide interconnection must allow high current to pass therethrough, the plug, which is arranged in an underlayer of the wide interconnection and to be coupled to the wide interconnection, desirably has a lower resistance value. Thus, it is desirable to lower the resistance value of the plug that is arranged in an underlayer of the wide interconnection and to be coupled to the wide interconnection. From such a viewpoint, there is a room for improvement in a current semiconductor device and in a current technique for manufacturing the semiconductor device. In other words, from the viewpoint of improving performance of the semiconductor device, there is a room for improvement in the current semiconductor device and in the current technique for manufacturing the semiconductor device.

Other issues and novel features will be clarified from the description of this specification and the accompanying drawings.

According to an embodiment of the present invention, there is provided a semiconductor device that includes a wide interconnection (first copper interconnection) and a narrow interconnection (second copper interconnection) provided in the same layer, in which a resistance value of a first plug (first copper plug) that is arranged in an underlayer of the wide interconnection and to be coupled to the wide interconnection is lower than a resistance value of a second plug (second copper plug) that is arranged in an underlayer of the narrow interconnection and to be coupled to the narrow interconnection.

According to another embodiment of the present invention, there is provided a method of manufacturing a semiconductor device, the method including a step of depositing a tantalum nitride film by a sputtering process with tantalum as a target and with nitrogen gas introduced into a processing chamber, in which deposition time in the deposition step is within a range in which the tantalum nitride film formed on the bottom of a first plug (first copper plug) has a thickness of 5 to 10 nm.

According to another embodiment of the present invention, there is provided a method of manufacturing a semiconductor device, the method including a step of, after exhausting nitrogen gas, forming a tantalum film on a tantalum nitride film by a sputtering process with tantalum as a target and with a substrate draw bias being applied to the semiconductor substrate, in which the substrate draw bias is applied such that an electric potential on the semiconductor substrate is within a range from −350 to −800 V.

According to the above-described respective embodiments, performance of the semiconductor device can be improved.

DETAILED DESCRIPTION

Although the following embodiment may be dividedly described in a plurality of sections or embodiments for convenience as necessary, they are not unrelated to one another except for the particularly defined case, and are in a relationship where one is a modification, a detail, supplementary explanation, or the like of part or all of another one.

In the following embodiment, when the number of elements and the like (including the number, a numerical value, amount, a range, etc.) are mentioned, the number is not limited to a specified number except for the particularly defined case and for the case where the number is principally clearly limited to the specified number. In other words, the number may be not less than or not more than the specified number.

In the following embodiment, it will be appreciated that a constitutional element (including an element step etc.) of the embodiment are not necessarily indispensable except for the particularly defined case and for the case where the constitutional element is considered to be principally clearly indispensable.

Similarly, in the following embodiment, description on a shape of a constitutional element or the like, a positional relationship, etc., is intended to include an element having a shape or the like substantially similar to that of the constitutional element except for the particularly defined case and for the case where such an element is considered to be principally clearly not included. The same holds true in each of the numerical value and the range.

In all drawings for explaining the following embodiment, the same components are in principle designated by the same numeral, and duplicated description is omitted. A plan diagram may also be hatched for better viewability.

First Embodiment

<Device Structure of Semiconductor Device>

Figure 1:
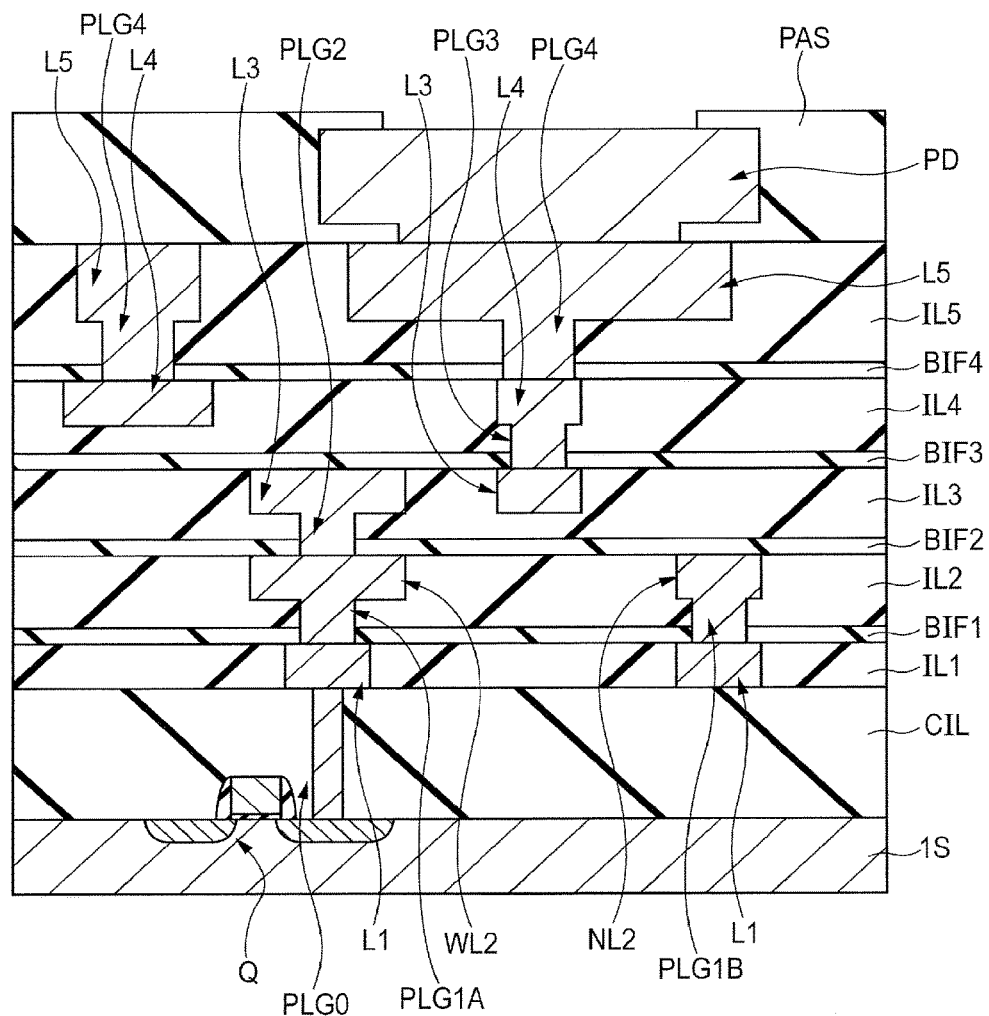
FIG. 1 is a section diagram illustrating an exemplary device structure of a semiconductor device.

An exemplary device structure of a semiconductor device is now described. FIG. 1 is a section diagram illustrating an exemplary device structure of a semiconductor device. In FIG. 1, for example, MISFETQ is provided on a semiconductor substrate 1S comprised of silicon single crystal. For example, the MISFETQ has a gate insulating film comprised of a silicon oxide film on a main surface of the semiconductor substrate 1S, and has, on the gate insulating film, a gate electrode comprised of a stacked film of a polysilicon film and a silicide film (such as a nickel silicide film) provided on the polysilicon film. For example, a sidewall comprised of a silicon oxide film is provided on each of lateral walls on two sides of the gate electrode. A source region and a drain region are provided in alignment with the gate electrode in the semiconductor substrate 1S below the sidewalls. In this way, the MISFETQ is provided on the semiconductor substrate 1S.

In addition, as illustrated in FIG. 1, a contact interlayer insulating film CIL is provided on the semiconductor substrate having the MISFETQ thereon. For example, the contact interlayer insulating film CIL is comprised of a stacked film of an ozone TEOS film formed by a thermal CVD process using ozone and tetra ethyl ortho silicate (TEOS) as materials, and a plasma TEOS film formed on the ozone TEOS film by a plasma CVD process using TEOS as a material. A plug PLG0 is provided while penetrating through the contact interlayer insulating film CIL up to the source or drain region of the MISFETQ. For example, the plug PLG0 is formed by filling a contact hole with a barrier conductor film comprised of a titanium/titanium nitride film (hereinafter, the titanium/titanium nitride film refers to a film comprised of titanium and titanium nitride provided on the titanium), and with a tungsten film provided on the barrier conductor film. The titanium/titanium nitride film is provided to prevent diffusion of tungsten configuring the tungsten film into silicon, and prevents the contact interlayer insulating film CIL or the semiconductor substrate 1S from being damaged by fluorine attack thereto during a CVD process in which WF6 (tungsten fluoride) is reduced during formation of the tungsten film. The contact interlayer insulating film CIL may be comprised of one of a silicon oxide film ($SiO_2$ film), a SiOF film, and a silicon nitride film.

In addition, an interconnection L1 as a first layer interconnection is provided on the contact interlayer insulating film CIL. Specifically, the interconnection L1 is provided in an embedded manner in an interlayer insulating film IL1 provided on the contact interlayer insulating film CIL having the plug PLG0 therein. Specifically, the interconnection L1 is formed by filling an interconnection trench, which penetrates through the interlayer insulating film IL1 so as to expose the plug PLG0 at its bottom, with a film including copper as a main component (hereinafter, described as copper film).

In this specification, "main component" refers to a material component contained in largest quantities among constitutional materials of an element (a layer or film). For example, "film including copper as a main component" means that copper (Cu) is contained in largest quantities among constitutional materials of that film. In this specification, for example, the term "main component" is intentionally used to represent that a conductor film is basically comprised of copper but without excluding the case where the conductor film further contains impurities.

For example, the interlayer insulating film IL1 is comprised of a SiOC film, a hydrogen silsesquioxane (HSQ) film (a silicon oxide film formed by a coating process and having a Si—H bond, or a hydrogen-containing silsesquioxane film), or a methyl silsesquioxane (MSQ) film (a silicon oxide film formed by a coating process and having a Si—C bond, or a carbon-containing silsesquioxane film). In this specification, an interconnection layer having the interconnection L1 therein may be referred to as fine layer.

In addition, a second layer interconnection is provided on the interlayer insulating film IL1 having the interconnection L1 therein. For example, FIG. 1 illustrates a wide interconnection WL2 and a narrow interconnection NL2 having different line widths as the second layer interconnection. Specifically, the second layer interconnection illustrated in FIG. 1 has the wide interconnection WL2 having a large line width and the narrow interconnection NL2 having a small line width. In other words, in the semiconductor device, for example, the wide interconnection WL2 and the narrow interconnection NL2 having different line widths are provided in the same interconnection layer having the second layer interconnection therein. In this configuration, for example, the wide interconnection WL2 is used as a power line that allows high current to pass therethrough, while the narrow interconnection NL2 is used as a signal line that may not allow such high current to pass therethrough. Although description is made herein on an exemplary case where the second layer interconnection has the wide interconnection WL2 and the narrow interconnection NL2 having different line widths, any of other interconnection layers also has a plurality of interconnections having different line widths in the same layer.

In this way, the second layer interconnection is provided on the interlayer insulating film IL1. Specifically, a barrier insulating film B1F1 (liner film) is provided on the interlayer insulating film IL1 having the interconnection L1 therein, and an interlayer insulating film IL2 is provided on the barrier insulating film B1F1. For example, the barrier insulating film B1F1 is comprised of one of a stacked film of a SiCN film and a SiCO film provided on the SiCN film, a SiC film, and a SiN film. For example, the interlayer insulating film IL2 is comprised of one of a SiOC film having vacancies, a HSQ film having vacancies, and a MSQ film having vacancies. Each of the vacancies has a size (diameter) of, for example, about 1 nm. The wide interconnection WL2, the narrow interconnection NL2, a plug PLG1A, and a plug PLG1B are provided in an embedded manner in the barrier insulating film B1F1 and the interlayer insulating film IL2. In this configuration, the plug PLG1A and the plug PLG1B are provided with the same size in the same layer. The wide interconnection WL2, the narrow interconnection NL2, the plug PLG1A, and the plug PLG1B are each comprised of, for example, a copper film. The interconnection layer, in which the second layer interconnection including the wide interconnection WL2 and the narrow interconnection NL2 is provided, is also referred to as fine layer.

As illustrated in FIG. 1, a third layer interconnection and a fourth layer interconnection are provided in the same way as the second layer interconnection. Specifically, a barrier insulating film BIF2 is provided on the interlayer insulating film IL2, and an interlayer insulating film IL3 is provided on the barrier insulating film BIF2. For example, the barrier insulating film B1F2 is comprised of one of a stacked film of a SiCN film and a SiCO film provided on the SiCN film, a SiC film, and a SiN film. For example, the interlayer insulating film IL3 is comprised of one of a SiOC film having vacancies, a HSQ film having vacancies, and a MSQ film having vacancies. An interconnection L3 as the third layer interconnection and a plug PLG2 are provided in an embedded manner in the barrier insulating film B1F2 and the interlayer insulating film IL3. The interconnection L3 and the plug PLG2 are each also comprised of, for example, a copper film.

In addition, a barrier insulating film BIF3 is provided on the interlayer insulating film IL3, and an interlayer insulating film IL4 is provided on the barrier insulating film BIF3. For example, the barrier insulating film B1F3 is comprised of one of a stacked film of a SiCN film and a SiCO film provided on the SiCN film, a SiC film, and a SiN film. For example, the interlayer insulating film IL4 is comprised of one of a SiOC film having vacancies, a HSQ film having vacancies, and a MSQ film having vacancies. An interconnection L4 as the fourth layer interconnection and a plug PLG3 are provided in an embedded manner in the barrier insulating film B1F3 and the interlayer insulating film IL4. The interconnection L4 and the plug PLG3 are each also comprised of, for example, a copper film. The interconnection layer having the interconnection L3 therein and the interconnection layer having the interconnection L4 therein are each also referred to as fine layer.

In addition, a barrier insulating film BIF4 is provided on the interlayer insulating film IL4, and an interlayer insulating film IL5 is provided on the barrier insulating film BIF4. For example, the barrier insulating film B1F4 is comprised of one of a stacked film of a SiCN film and a SiCO film, a SiC film, and a SiN film. For example, the interlayer insulating film IL5 is comprised of one of a silicon oxide film ($SiO_2$ film), a SiOF film, and a TEOS film. A plug PLG4 and an interconnection L5 as the fifth layer interconnection are provided in an embedded manner in the barrier insulating film B1F4 and the interlayer insulating film IL5. The interconnection L5 and the plug PLG4 are each also comprised of, for example, a copper film. The interconnection layer having the interconnection L5 therein is referred to as global layer.

In addition, a pad PD as a sixth layer interconnection is provided on the interlayer insulating film IL5. For example, the pad PD is comprised of a film including aluminum as a main component. Specifically, for example, the pad PD is comprised of one of an aluminum film, an AlSi film including silicon-doped aluminum, and an AlSiCu film including aluminum doped with silicon and copper.

A passivation film PAS is provided on the pad PD, and part of the pad PD is exposed from an opening provided in the passivation film PAS. The passivation film PAS has a function of protecting the device against contamination of an impurity, and is, for example, comprised of a silicon oxide film and a silicon nitride film provided on the silicon oxide film. An undepicted polyimide film is provided on the passivation film PAS. The polyimide film is also opened over a region where the pad PD is provided.

For example, the pad PD is coupled to an undepicted wire, and a resin as a sealant seals a region on the polyimide film, the region including a portion on the pad PD coupled to the wire. The device structure of the semiconductor device illustrated in FIG. 1 is configured in this way.

In the device structure illustrated in FIG. 1, the first to sixth interconnection layers are provided. For example, the first to fourth interconnection layers each configure the fine layer, and the fifth interconnection layer configures the global layer. The term "fine layer" refers to an interconnection layer having a fine interconnection in near minimum working size. The term "global layer" refers to an interconnection layer in which an interconnection having a size larger than that of the fine layer is provided. Although FIG. 1 illustrates an exemplary case where the global layer is provided on the fine layer to simply describe the multilayer interconnection structure, it is in fact normal that "semi-global layer" is provided on the fine layer, and the global layer is provided on the semi-global layer. The term "semi-global layer" refers to an interconnection layer having a size larger than that of the fine layer but smaller than that of the global layer. In other words, when attention is focused on interconnection size, the semi-global layer is an interconnection layer having an interconnection having a size intermediate between the fine layer and the global layer.

<Room for Improvement>

A schematic device structure of the semiconductor device has been described with reference to FIG. 1. For example, when attention is focused on an actual copper interconnection, the copper interconnection is comprised of a barrier conductor film and a copper film. In order to reduce size of a semiconductor device and increase integration thereof, it is necessary for a copper interconnection to be finer. As a result of investigation by the inventors, however, it has been found that a finer copper interconnection causes a difficulty in barrier conductor film included in the copper interconnection, leading to a room for improvement in terms of improvement in performance of the semiconductor device. In other words, when attention is focused on the barrier conductor film included in the copper interconnection, the current semiconductor device has a room for improvement in terms of improvement in performance of the semiconductor device. Specifically, a semiconductor device including a copper interconnection and a copper plug formed by the damascene process has a room for improvement in terms of lowering a resistance value of the copper plug that is arranged in an underlayer of the copper interconnection and to be coupled to the copper interconnection. Such a room for improvement is now described with reference to drawings.

Figure 2:
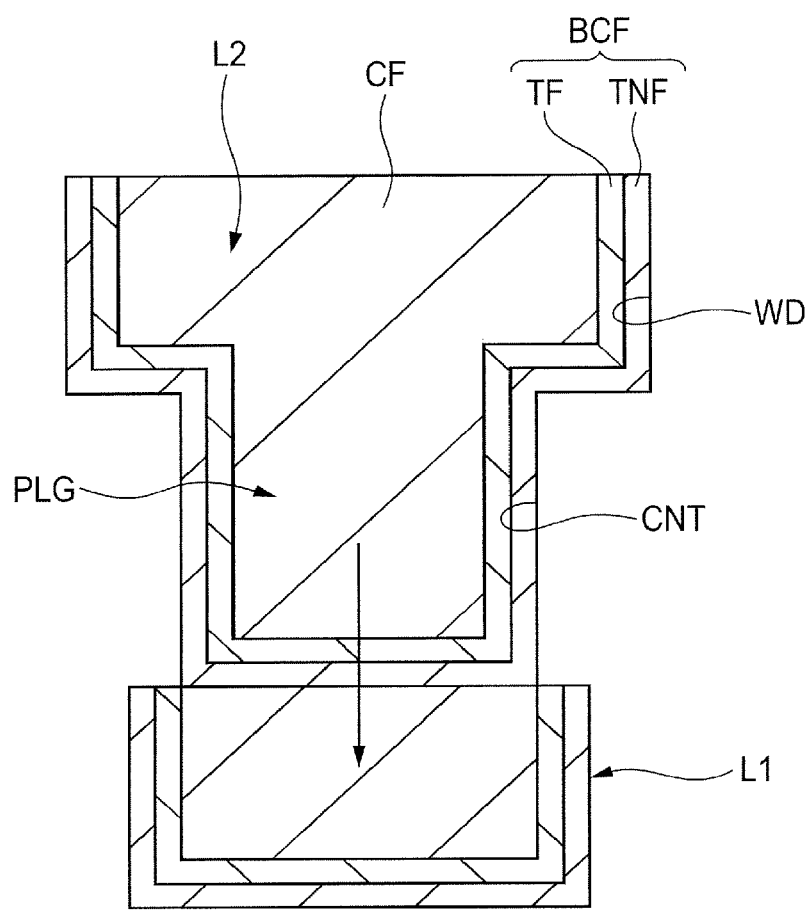
FIG. 2 is a section diagram schematically illustrating an exemplary configuration of a multilayer interconnection structure in a partially enlarged manner.

FIG. 2 is a section diagram schematically illustrating an exemplary configuration of a multilayer interconnection structure in a partially enlarged manner. As illustrated in FIG. 2, for example, a plug PLG and an interconnection L2, which each include copper as a main component and are integrally formed by "dual damascene process", are arranged on the interconnection L1 that includes copper as a main component and is formed by "single damascene process". That is, the interconnection L1 as a lower interconnection is electrically coupled to the interconnection L2 as an upper interconnection via the plug PLG. The plug PLG is formed by filling a connection hole CNT with a barrier conductor film BCF and a copper film, and the interconnection L2 is formed by filling an interconnection trench WD integrally formed with the connection hole CNT with the barrier conductor film BCF and the copper film CF. For example, the barrier conductor film BCF is comprised of a tantalum nitride film TNF provided on each of inner walls of the connection hole CNT and the interconnection trench WD, and a tantalum film TF provided on the tantalum nitride film TNF.

In this way, the barrier conductor film BCF is provided on each of the inner walls of the connection hole CNT and the interconnection trench WD instead of directly providing the copper film thereon. This is to prevent diffusion of copper configuring the copper film into silicon configuring the semiconductor substrate due to heat treatment or the like. Specifically, since the diffusion constant of a copper atom into silicon is relatively large, copper easily diffuses into silicon. A semiconductor element such as MISFET is provided in the semiconductor substrate. Diffusion of copper atoms into a formation region of the semiconductor element causes degradation in properties of the semiconductor element typified by insufficient withstanding voltage. Consequently, the barrier conductor film BCF is provided to prevent copper atoms from being diffused from the copper film configuring the interconnection. In other words, the barrier conductor film BCF has a function of preventing diffusion of copper atoms. In this way, for example, as illustrated in FIG. 2, the actual multilayer interconnection is designed such that the plug PLG and the interconnection L2, which are integrally formed and each include copper as a main component, are arranged on the interconnection L1 including copper as a main component.

In FIG. 2, it is assumed that line width of the interconnection L2 is large compared with the minimum working size. In this case, even if the thickness of the barrier conductor film BCF is increased, degradation in filling properties is less likely to be a significant problem when the interconnection trench WD is filled with the copper film CF. Hence, the barrier conductor film BCF having a large thickness is provided on each of the inner walls of the connection hole CNT and the interconnection trench WD.

Figure 3:
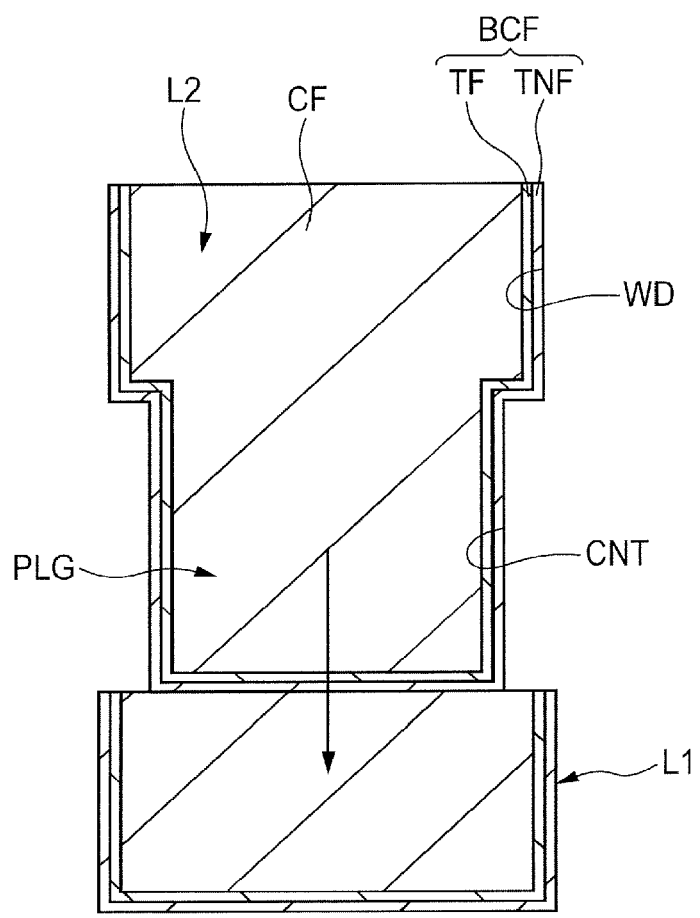
FIG. 3 is a section diagram schematically illustrating an exemplary configuration of a multilayer interconnection structure having a fine interconnection with a half pitch of, for example, about 60 nm or 45 nm in a partially enlarged manner.

However, in the case where a fine interconnection with a half pitch of, for example, about 60 nm or 45 nm is formed, a different situation occurs. FIG. 3 is a section diagram schematically illustrating an exemplary configuration of a multilayer interconnection structure having a fine interconnection with a half pitch of, for example, about 60 nm or 45 nm in a partially enlarged manner. In FIG. 3, the plug PLG and the interconnection L2, which are integrally formed by the dual damascene process and each include copper as a main component, are also arranged on the interconnection L1 that is formed by the single damascene process and includes copper as a main component. In this configuration, when the interconnection L2 is a fine interconnection, and if the thickness of the barrier conductor film BCF is increased, degradation in filling properties becomes a significant problem when the interconnection trench WD is filled with the copper film CF. Hence, the barrier conductor film BCF on each of the inner walls of the connection hole CNT and the interconnection trench WD is necessary to have a thickness smaller than that of the barrier conductor film BCF illustrated in FIG. 2.

Comparing FIG. 2 with FIG. 3, therefore, even if size of the plug PLG illustrated in FIG. 2 is equal to size of the plug PLG illustrated in FIG. 3, the thickness of the barrier conductor film BCF provided on the bottom of the plug PLG illustrated in FIG. 3 is smaller than the thickness of the barrier conductor film BCF provided on the bottom of the plug PLG illustrated in FIG. 2. Consequently, plug resistance (via resistance) of the plug PLG illustrated in FIG. 2 is different from plug resistance of the plug PLG illustrated in FIG. 3.

Specifically, resistivity (specific resistance) of the barrier conductor film BCF is higher than resistivity of the copper film CF. Consequently, when current is applied from the interconnection L2 to the interconnection L1 via the plug PLG (see an arrow in each of FIGS. 2 and 3), it is likely that plug resistance of the plug PLG with the thick barrier conductor film BCF illustrated in FIG. 2 is higher than plug resistance of the plug PLG with the thin barrier conductor film BCF illustrated in FIG. 3. Actually, however, plug resistance of the plug PLG with the thick barrier conductor film BCF illustrated in FIG. 2 is higher than plug resistance of the plug PLG with the thin barrier conductor film BCF illustrated in FIG. 3. In other words, plug resistance of the plug PLG with the thin barrier conductor film BCF illustrated in FIG. 3 is higher than plug resistance of the plug PLG with the thick barrier conductor film BCF illustrated in FIG. 2. Specifically, as illustrated in FIG. 3, when the interconnection L2 is comprised of a fine interconnection with a half pitch of, for example, about 60 nm or 45 nm, plug resistance of the plug PLG, which is arranged in an underlayer of the interconnection L2 and to be coupled to the interconnection L2, increases.

Thus, plug resistance of the plug PLG with the thin barrier conductor film BCF illustrated in FIG. 3 is higher than plug resistance of the plug PLG with the thick barrier conductor film BCF illustrated in FIG. 2. One reason for this is now described.

In FIG. 2, the barrier conductor film BCF having a large thickness is provided on the bottom of the plug PLG. In this case, the barrier conductor film BCF is comprised of the tantalum nitride film TNF and the tantalum film TF provided on the tantalum nitride film TNF; hence, it can be considered that the tantalum nitride film TNF also has a sufficiently large thickness. When the tantalum nitride film TNF has a sufficiently large thickness in this way, the tantalum film TF provided on the tantalum nitride film TNF has a crystal structure of a α-Ta structure being a body-centered structure.

On the other hand, in FIG. 3, the barrier conductor film BCF having a small thickness is provided on the bottom of the plug PLG. Hence, it can be considered that the tantalum nitride film TNF as a constitutional film of the barrier conductor film BCF also has a small thickness. When the tantalum nitride film TNF has a small thickness in this way, the tantalum film TF provided on the tantalum nitride film TNF has a crystal structure of a β-Ta structure being a tetragonal structure.

That is, while the crystal structure of tantalum is the α-Ta structure in the case of the plug PLG with the thick barrier conductor film BCF illustrated in FIG. 2, the crystal structure of tantalum is the β-Ta structure in the case of the plug PLG with the thin barrier conductor film BCF illustrated in FIG. 3. This causes the plug resistance of the plug PLG illustrated in FIG. 3 to be higher than the plug resistance of the plug PLG illustrated in FIG. 2. This is because resistivity of the α-Ta structure is lower than resistivity of the β-Ta structure. Specifically, the entire plug PLG with the thick barrier conductor film BCF illustrated in FIG. 2 has a low plug resistance. This is because although the barrier conductor film BCF has a large thickness, the tantalum film configuring the barrier conductor film BCF has a crystal structure of the α-Ta structure having low resistivity. On the other hand, the entire plug PLG with the thin barrier conductor film BCF illustrated in FIG. 3 has a high plug resistance. This is because although the barrier conductor film BCF has a small thickness, the tantalum film configuring the barrier conductor film BCF has a crystal structure of the β-Ta structure having high resistivity.

Thus, when attention is focused only on the thickness itself of the barrier conductor film BCF, it is likely that the plug resistance of the plug PLG illustrated in FIG. 2 is higher than the plug resistance of the plug PLG illustrated in FIG. 3. Actually, however, considering that the tantalum film has different crystal structures between the plug PLG illustrated in FIG. 2 and the plug PLG illustrated in FIG. 3, the plug resistance of the plug PLG illustrated in FIG. 2 is lower than the plug resistance of the plug PLG illustrated in FIG. 3. Specifically, when the tantalum nitride film has a large thickness, the tantalum film provided on the tantalum nitride film has a crystal structure of the α-Ta structure having low resistivity. Hence, in terms of lowering the plug resistance of the plug PLG, the thickness of the tantalum nitride film provided under the tantalum film is desirably increased to the extent that the tantalum film has a crystal structure of the α-Ta structure.

Figure 4:
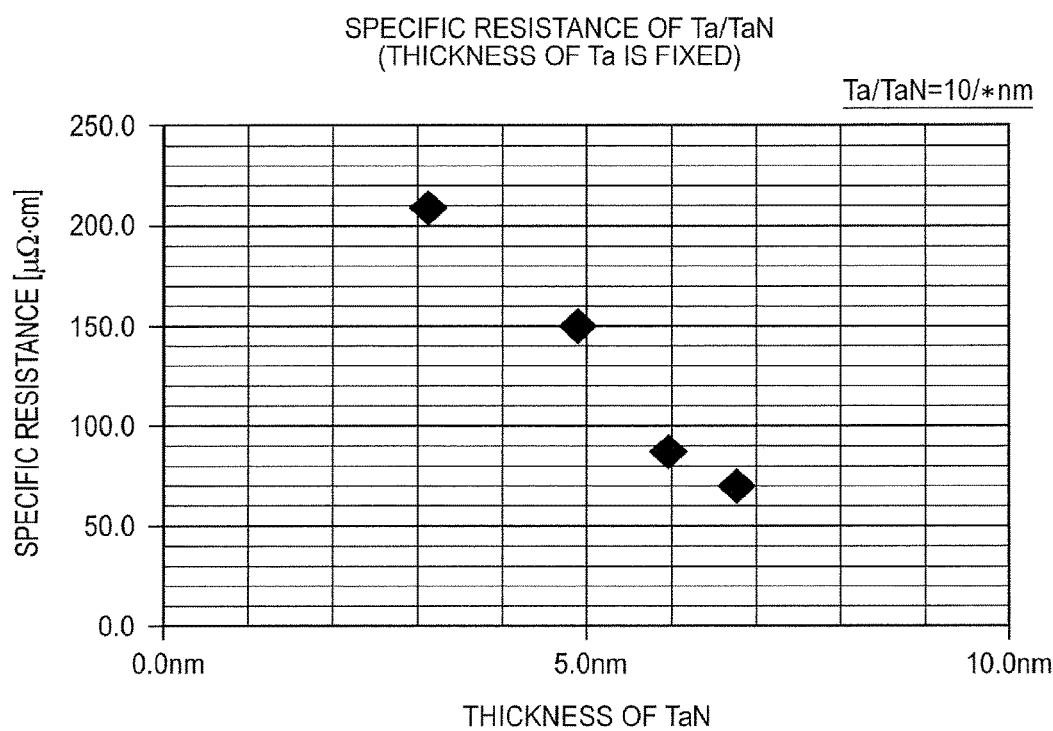
FIG. 4 is a graph illustrating a relationship between specific resistance (resistivity) of a stacked film of a tantalum nitride film and a tantalum film formed thereon, and thickness of the tantalum nitride film.

FIG. 4 is a graph illustrating a relationship between specific resistance (resistivity) of a stacked film of the tantalum nitride film and the tantalum film formed thereon, and thickness of the tantalum nitride film. In FIG. 4, a horizontal axis shows thickness (TaN thickness) of the tantalum nitride film, and a vertical axis shows specific resistance of the stacked film. In this case, the stacked film of the tantalum nitride film and the tantalum film provided thereon is prepared, and thickness of the tantalum nitride film is varied while thickness of the tantalum film (Ta thickness) is fixed. The graph of FIG. 4 shows a measurement results of the specific resistance of the stacked film in such a case. As illustrated in FIG. 4, increasing the thickness of the tantalum nitride film decreases the specific resistance of the stacked film of the tantalum nitride film and the tantalum film provided thereon. Specifically, when the thickness of the tantalum nitride film is about 3 nm, the specific resistance of the stacked film is about 210 μΩ·cm. When the thickness of the tantalum nitride film is about 5 nm, the specific resistance of the stacked film is about 150 μΩ·cm. When the thickness of the tantalum nitride film is about 6 nm, the specific resistance of the stacked film is about 90 μΩ·cm. When the thickness of the tantalum nitride film is about 7 nm, the specific resistance of the stacked film decreases to about 70 μΩ·cm. In particular, the specific resistance of the stacked film remarkably varies at a thickness of the tantalum nitride film of about 5 nm or more. It is therefore likely that when the tantalum nitride film has a thickness of, for example, 5 nm or more, the tantalum film provided on the tantalum nitride film has a crystal structure of the α-Ta structure, leading to low specific resistance of the stacked film. In other words, when the tantalum nitride film has a thickness of, for example, less than 5 nm, the tantalum film provided on the tantalum nitride film has a crystal structure of the β-Ta structure, leading to high specific resistance of the stacked film. Hence, the results shown in FIG. 4 possibly back up that the thickness of the tantalum nitride film provided under the tantalum film is desirably increased to the extent that the tantalum film has a crystal structure of the α-Ta structure in terms of decreasing the plug resistance of the plug PLG.

In this way, the thickness of the tantalum nitride film provided under the tantalum film is desirably increased in terms of decreasing the plug resistance of the plug PLG. As described above, however, when the interconnection L2 is a fine interconnection (with a half pitch of about 60 nm or 45 nm), and if the thickness of the barrier conductor film BCF is increased, it is a significant problem that filling properties are degraded when the interconnection trench WD is filled with the copper film CF. Consequently, the interconnection L2 as a fine interconnection illustrated in FIG. 3 is necessary to be designed such that the barrier conductor film BCF provided on each of the inner walls of the connection hole CNT and the interconnection trench WD has a small thickness in terms of improving the filling properties. In this case, however, as illustrated in FIG. 3, the tantalum nitride film provided on the bottom of the plug PLG has a small thickness, and thus the tantalum film provided on the tantalum nitride film has a crystal structure of the β-Ta structure having high resistivity. This results in high plug resistance of the plug PLG to be coupled to the interconnection L2 as a fine interconnection illustrated in FIG. 3.

However, such high plug resistance is actually a significant problem, for example, in the plug PLG1A to be electrically coupled to the wide interconnection WL2 provided in the same layer as the narrow interconnection NL2 illustrated in FIG. 1. Specifically, when attention is focused on the wide interconnection WL2 and the narrow interconnection NL2 provided in the same layer as illustrated in FIG. 1, the above-described problem is significant in the plug PLG1A electrically coupled to the wide interconnection WL2 having a large line width and provided in the same layer as the narrow interconnection NL2 rather than the plug PLG1B electrically coupled to the narrow interconnection NL2 having a small line width. In this regard, description is made below.

Figure 5:
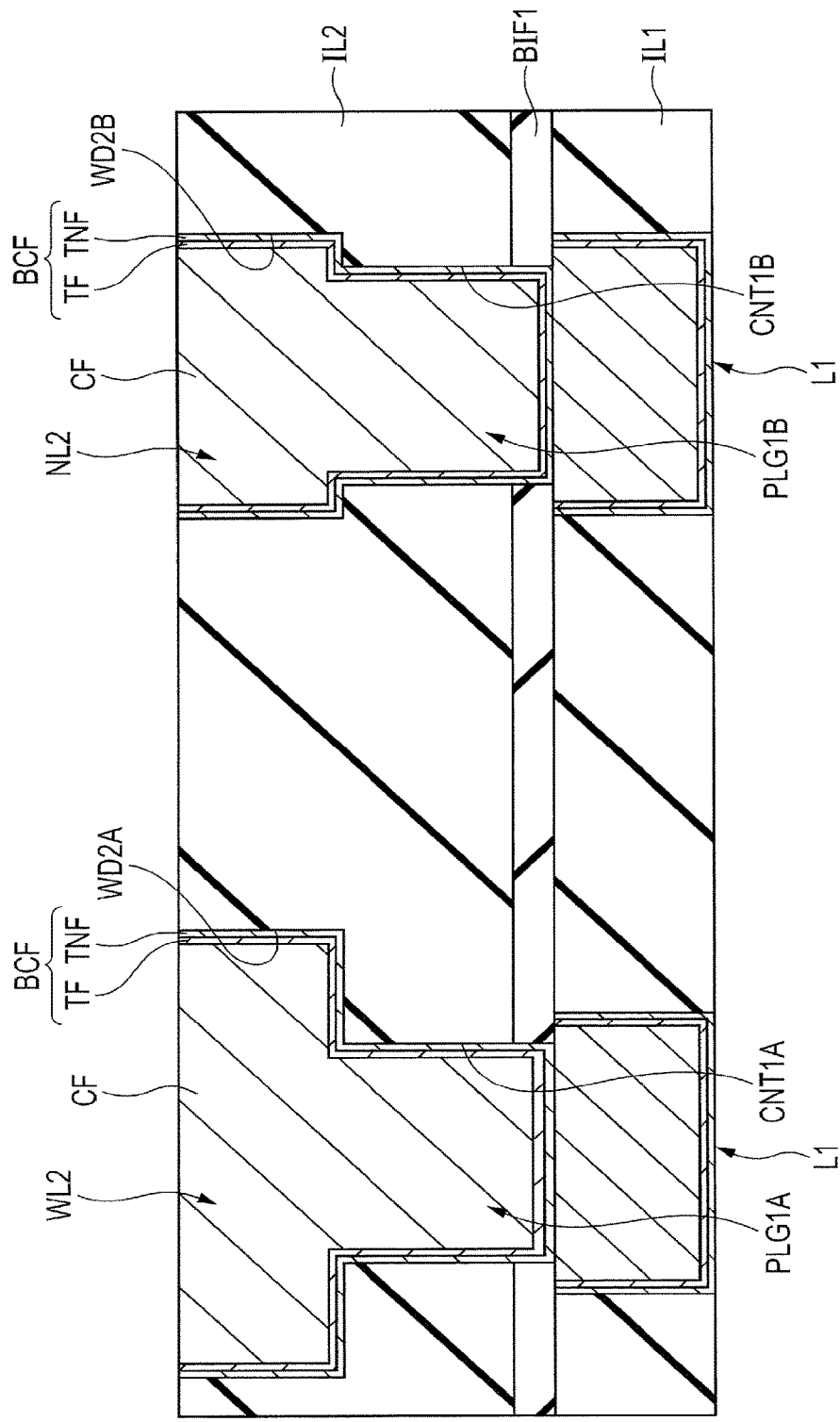
FIG. 5 is a section diagram illustrating the multilayer interconnection structure illustrated in FIG. 1 in a partially enlarged manner.

FIG. 5 is a section diagram illustrating the multilayer interconnection structure illustrated in FIG. 1 in a partially enlarged manner. In FIG. 5, for example, the barrier insulating film B1F1 is provided on the interlayer insulating film IL1 having therein the interconnection L1 as the first interconnection, and the interlayer insulating film IL2 is provided on the barrier insulating film B1F1. The interconnection trench WD2A and the connection hole CNT1A are integrally provided in the barrier insulating film B1F1 and the interlayer insulating film IL2 so as to penetrate through the barrier insulating film B1F1 and the interlayer insulating film IL2. Similarly, the interconnection trench WD2B and the connection hole CNT1B are integrally provided in the barrier insulating film B1F1 and the interlayer insulating film IL2 so as to penetrate through the barrier insulating film B1F1 and the interlayer insulating film IL2.

The barrier conductor film BCF is provided on each of the inner walls of the interconnection trench WD2A and the connection hole CNT1A, and the copper film CF is provided on the barrier conductor film BCF so as to fill the interconnection trench WD2A and the connection hole CNT1A. Thus, there is provided the plug PLG1A including the barrier conductor film BCF and the copper film CF filling the connection hole CNT1A, and provided the wide interconnection WL2 including the barrier conductor film BCF and the copper film CF filling the interconnection trench WD2A.

Similarly, the barrier conductor film BCF is provided on each of the inner walls of the interconnection trench WD2B and the connection hole CNT1B, and the copper film CF is provided on the barrier conductor film BCF so as to fill the interconnection trench WD2B and the connection hole CNT1B. Thus, there is provided the plug PLG1B including the barrier conductor film BCF and the copper film CF filling the connection hole CNT1B, and provided the narrow interconnection NL2 including the barrier conductor film BCF and the copper film CF filling the interconnection trench WD2B.

In this way, the wide interconnection WL2 and the narrow interconnection NL2 are provided in the same layer, and the plug PLG1A and the plug PLG1B are provided in the same layer. That is, as illustrated in FIG. 5, the wide interconnection WL2 and the narrow interconnection NL2 having different line widths are provided in the same layer. The wide interconnection WL2 and the narrow interconnection NL2 are formed in the same layer in one step by the damascene process, for example. For example, the narrow interconnection NL2 is a fine interconnection formed in minimum working size, and the barrier conductor film BCF provided in the narrow interconnection NL2 is necessary to be small in thickness in order to secure filling properties of a film in the damascene process. Hence, the wide interconnection WL2 provided in the same layer as the narrow interconnection NL2 necessarily has the barrier conductor film BCF having a small thickness since the wide interconnection WL2 is formed in the same step as that for the narrow interconnection NL2. Consequently, the tantalum nitride film TNF, which is provided on the bottom of the plug PLG1A to be coupled to the wide interconnection WL2, has a small thickness, and thus the tantalum film TF provided on the tantalum nitride film TNF has a crystal structure of the β-Ta structure having high resistivity. This results in high plug resistance of the plug PLG1A to be coupled to the wide interconnection WL2. Naturally, the tantalum nitride film TNF, which is provided on the bottom of the plug PLG1B to be coupled to the narrow interconnection NL2, also has a small thickness, and thus the tantalum film TF provided on the tantalum nitride film TNF has a crystal structure of the β-Ta structure having high resistivity. As a result, the plug PLG1B to be coupled to the narrow interconnection NL2 also has high plug resistance.

In this way, since the wide interconnection WL2 and the narrow interconnection NL2 are formed in the same layer in one step (by the dual damascene process), the thickness of the barrier conductor film BCF is limited in terms of the filling properties of the narrow interconnection NL2. Hence, the plug PLG1A to be coupled to the wide interconnection WL2 and the plug PLG1B to be coupled to the narrow interconnection NL2 are each increased in plug resistance. In this case, increase in plug resistance of the plug PLG1A to be coupled to the wide interconnection WL2 is a particularly significant problem causing degradation in performance of the semiconductor device. Some reasons for this are now described.

A first reason is that the wide interconnection WL2 is used as a power line for supplying power potential, for example. Specifically, the wide interconnection WL2 is used as a power line that allows high current to pass therethrough, and is therefore required to have low interconnection resistance. Hence, the plug PLG1A to be electrically coupled to the wide interconnection WL2 is also required to have low plug resistance. This is because if the plug PLG1A to be electrically coupled to the wide interconnection WL2 has high plug resistance, and when a high current is applied to the wide interconnection WL2, voltage drop in the plug PLG1A increases, so that significant voltage drop from the power voltage occurs.

On the other hand, in the case of the plug PLG1B to be electrically coupled to the narrow interconnection NL2, even if plug resistance somewhat increases, such an increase is not a significant problem. This is because the narrow interconnection NL2 is used as, for example, a signal line for transmitting a signal, and may not allow a current as high as the current for the power line to pass therethrough. Specifically, it is likely that the narrow interconnect ion NL2 is less affected by the plug resistance compared with the wide interconnection WL2 due to a difference in function between the narrow interconnection NL2 and the wide interconnection WL2. Consequently, increase in plug resistance is particularly serious in the plug PLG1A to be coupled to the wide interconnection WL2 in terms of suppressing degradation in performance of the semiconductor device.

A second reason is now described. As illustrated in FIG. 5, the thickness of the barrier conductor film BCF on the bottom of the plug PLG1A to be coupled to the wide interconnection WL2 is larger than the thickness of the barrier conductor film BCF on the bottom of the plug PLG1B to be coupled to the narrow interconnection NL2. In other words, even if such barrier conductor films BCF are formed in one step, the thickness of the barrier conductor film BCF on the bottom of the plug PLG1A is larger than the thickness of the barrier conductor film BCF on the bottom of the plug PLG1B.

Figure 6:
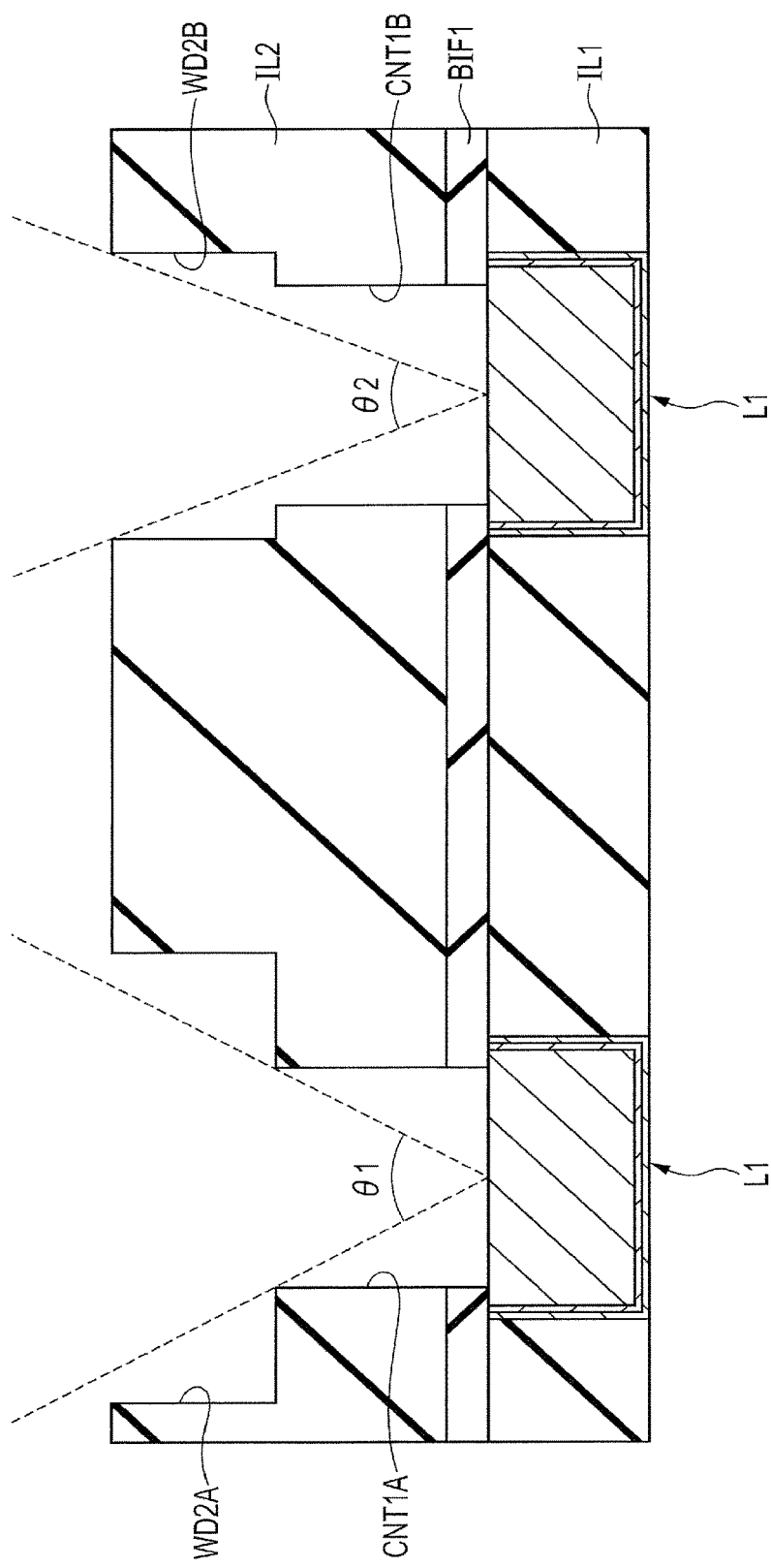
FIG. 6 is a diagram for qualitatively explaining a difference between thickness of a barrier conductor film provided on the bottom of a plug to be coupled to a wide interconnection, and a barrier conductor film provided on the bottom of a plug to be coupled to a narrow interconnection.

For example, this phenomenon can be qualitatively considered as follows. For example, the barrier conductor film BCF is formed by a sputtering process. In the sputtering process, for example, argon is allowed to collide with a target comprised of a deposition material to emit target atoms that then adhere onto the semiconductor substrate, and thereby deposition is performed. It is assumed that a barrier conductor film is formed on each of the bottoms of the connection hole CNT1A and the connection hole CNT1B by a one-step sputtering process, as illustrated in FIG. 6. In this case, a target atom adhering onto the bottom of the connection hole CNT1A possibly comes from a direction within a range defined by an angle θ1 illustrated in FIG. 6. On the other hand, a target atom adhering onto the bottom of the connection hole CNT1B possibly comes from a direction within a range defined by an angle θ2 illustrated in FIG. 6. Considering that width of the interconnection trench WD2A provided on the connection hole CNT1A is larger than width of the interconnection trench WD2B provided on the connection hole CNT1B as illustrated in FIG. 6, the angle θ1 is larger than the angle θ2. This means that the number of target atoms adhering onto the bottom of the connection hole CNT1A is larger than the number of target atoms adhering onto the bottom of the connection hole CNT1B. As a result, thickness of the barrier conductor film provided on the bottom of the connection hole CNT1A is larger than thickness of the barrier conductor film provided on the bottom of the connection hole CNT1B. Consequently, as illustrated in FIG. 5, thickness of the barrier conductor film BCF provided on the bottom of the plug PLG1A is larger than thickness of the barrier conductor film BCF provided on the bottom of the plug PLG1B.

Thus, since the barrier conductor film BCF provided on the bottom of the plug PLG1B to be coupled to the narrow interconnection NL2 has a small thickness, the tantalum film TF provided on the bottom of the plug PLG1B to be coupled to the narrow interconnection NL2 has a crystal structure of the β-Ta structure having high resistivity. On the other hand, while the barrier conductor film BCF provided on the bottom of the plug PLG1A to be coupled to the wide interconnection WL2 is formed to have a thickness larger than the thickness of the barrier conductor film BCF provided on the bottom of the plug PLG1B, the thickness of the formed tantalum nitride film TNF is still not large enough for the tantalum film TF to have a crystal structure of the α-Ta structure. Specifically, even if it is considered that the thickness of the barrier conductor film BCF provided on the bottom of the plug PLG1A is larger than the thickness of the barrier conductor film BCF provided on the bottom of the plug PLG1B, the tantalum nitride film TNF provided on the bottom of the plug PLG1A has a thickness of less than 5 nm in an existing deposition condition. Consequently, the tantalum film TF provided on the bottom of the plug PLG1A to be coupled to the wide interconnection WL2 is also likely to have a crystal structure of the β-Ta structure having high resistivity.

Hence, the tantalum film TF provided on the bottom of the plug PLG1A and the tantalum film TF provided on the bottom of the plug PLG1B have the same crystal structure of the β-Ta structure. Assuming this, when it is considered that the thickness of the barrier conductor film BCF provided on the bottom of the plug PLG1A is larger than the thickness of the barrier conductor film BCF provided on the bottom of the plug PLG1B, the plug resistance of the plug PLG1A to be coupled to the wide interconnection WL2 must be higher than the plug resistance of the plug PLG1B to be coupled to the narrow interconnection NL2.

Figure 7:
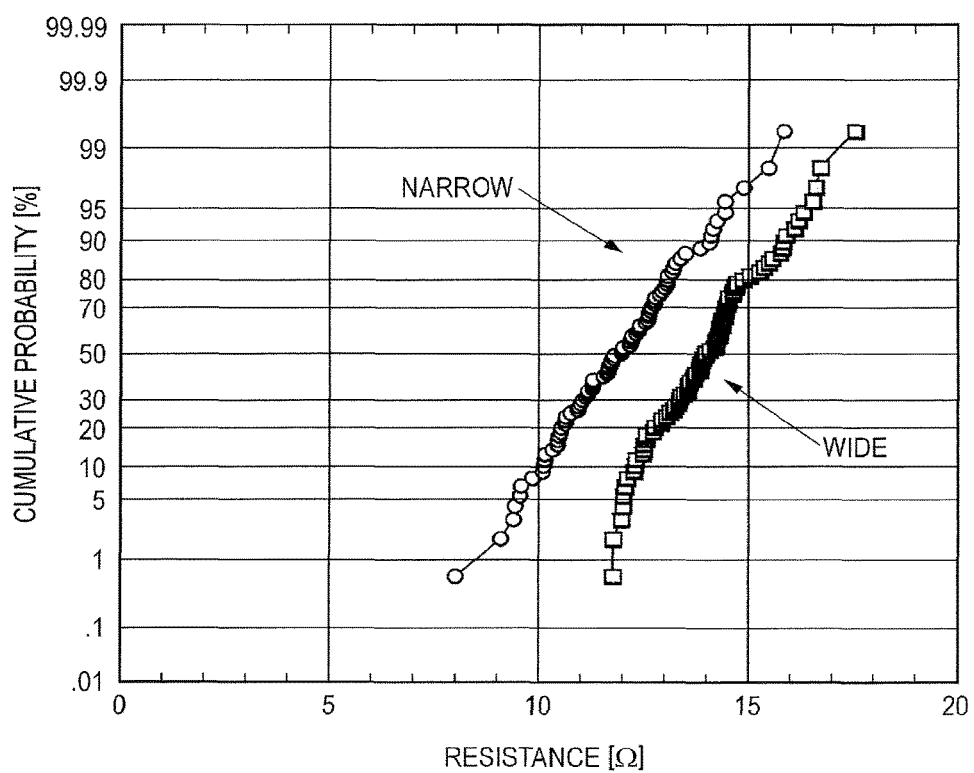
FIG. 7 includes graphs illustrating measurement results of plug resistance of a plug to be coupled to a wide interconnection and plug resistance of a plug to be coupled to a narrow interconnection in the related art.

FIG. 7 includes graphs illustrating measurement results of the plug resistance of the plug PLG1A to be coupled to the wide interconnection WL2 and the plug resistance of the plug PLG1B to be coupled to the narrow interconnection NL2 in the related art. In FIG. 7, a graph designated as "Wide" shows the plug resistance of the plug PLG1A to be coupled to the wide interconnection WL2, and a graph designated as "Narrow" shows the plug resistance of the plug PLG1B to be coupled to the narrow interconnection NL2. As illustrated in FIG. 7, the plug resistance of the plug PLG1A to be coupled to the wide interconnection WL2 is higher than the plug resistance of the plug PLG1B to be coupled to the narrow interconnection NL2.

In this way, increase in plug resistance of the plug PLG1A to be coupled to the wide interconnection WL2 is a significant problem. Specifically, the wide interconnection WL2 is used as a power line that allows high current to pass therethrough. In addition, the plug resistance of the plug PLG1A to be coupled to the wide interconnection WL2 is higher than the plug resistance of the plug PLG1B to be coupled to the narrow interconnection NL2. Such two events synergistically make the increase in plug resistance of the plug PLG1A, which is to be coupled to the wide interconnection WL2, to be a significant problem.

In this embodiment, therefore, there is devised a technique for suppressing the increase in plug resistance of the plug to be coupled to the wide interconnection in the semiconductor device having the wide interconnection and the narrow interconnection in the same layer. The technical idea of this embodiment as a basis of the devised technique is now described.

Structural Characteristics of Embodiment

Figure 8:
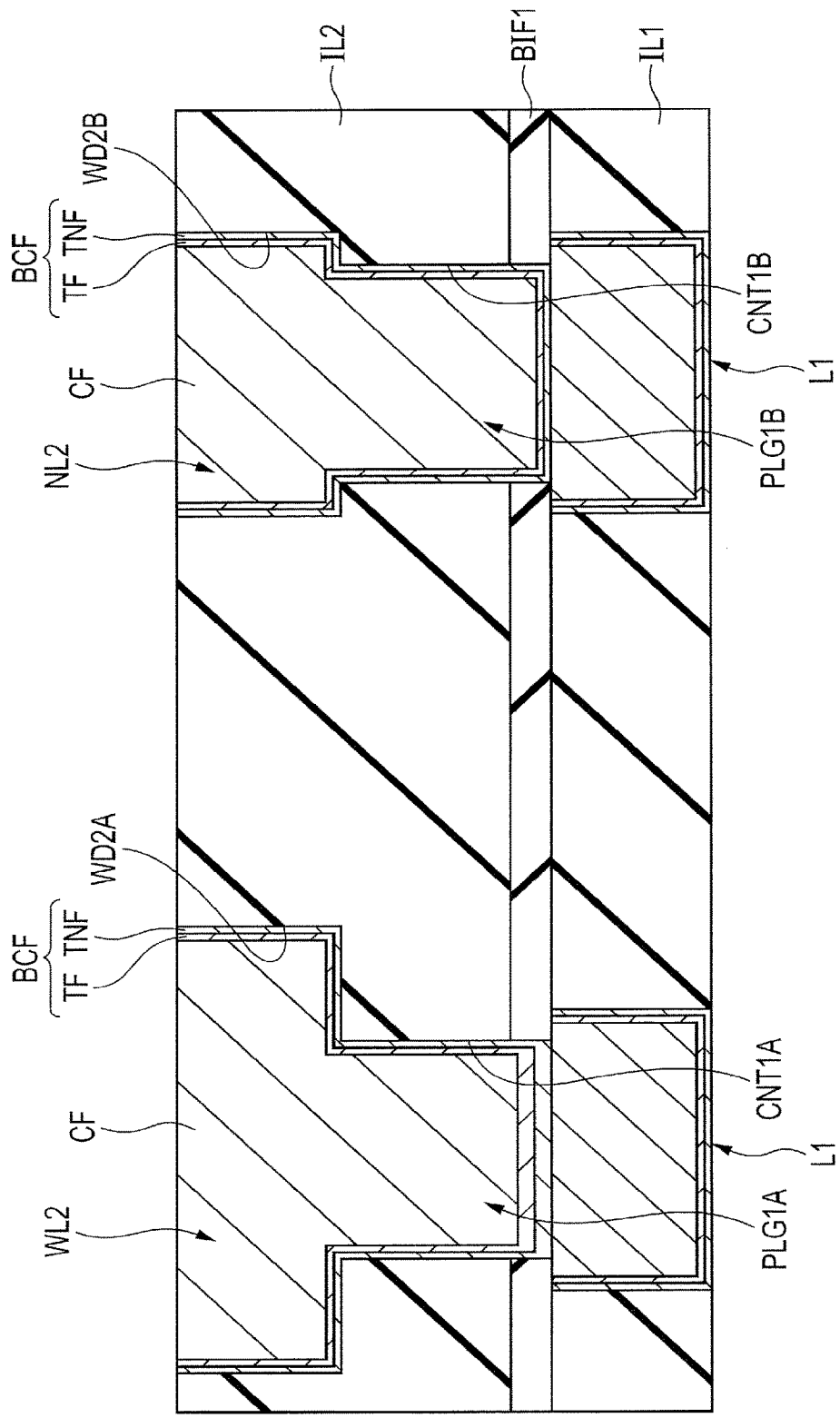
FIG. 8 is a section diagram illustrating a multilayer interconnection structure of an embodiment in a partially enlarged manner.

FIG. 8 is a section diagram illustrating a multilayer interconnection structure of this embodiment in a partially enlarged manner. In FIG. 8, for example, the barrier insulating film B1F1 is provided on the interlayer insulating film IL1 having therein the interconnection L1 as the first interconnection, and the interlayer insulating film IL2 is provided on the barrier insulating film B1F1. The interconnection trench WD2A and the connection hole CNT1A are integrally provided in the barrier insulating film B1F1 and the interlayer insulating film IL2 so as to penetrate through the barrier insulating film B1F1 and the interlayer insulating film IL2. Similarly, the interconnection trench WD2B and the connection hole CNT1B are integrally provided in the barrier insulating film B1F1 and the interlayer insulating film IL2 so as to penetrate through the barrier insulating film B1F1 and the interlayer insulating film IL2.

The barrier conductor film BCF is provided on each of the inner walls of the interconnection trench WD2A and the connection hole CNT1A, and the copper film CF is provided on the barrier conductor film BCF so as to fill the interconnection trench WD2A and the connection hole CNT1A. Thus, there is provided the plug PLG1A including the barrier conductor film BCF and the copper film CF filling the connection hole CNT1A, and provided the wide interconnection WL2 including the barrier conductor film BCF and the copper film CF filling the interconnection trench WD2A.

Similarly, the barrier conductor film BCF is provided on each of the inner walls of the interconnection trench WD2B and the connection hole CNT1B, and the copper film CF is provided on the barrier conductor film BCF so as to fill the interconnection trench WD2B and the connection hole CNT1B. Thus, there is provided the plug PLG1B including the barrier conductor film BCF and the copper film CF filling the connection hole CNT1B, and provided the narrow interconnection NL2 including the barrier conductor film BCF and the copper film CF filling the interconnection trench WD2B.

In this way, the semiconductor device of this embodiment includes the wide interconnection WL2 and the narrow interconnection NL2 that are provided in the same layer (the same interconnection layer) and each include copper as a main component, the plug PLG1A including copper as a main component and being arranged in an underlayer of the wide interconnection WL2 and coupled to the wide interconnection WL2, and the plug PLG1B including copper as a main component and being arranged in an underlayer of the narrow interconnection NL2 and coupled to the narrow interconnection NL2. Each of the plug PLG1A and the plug PLG1B includes the barrier conductor film BCF. In this configuration, while the line width of the wide interconnection WL2 is larger than the line width of the narrow interconnection NL2, the plug PLG1A and the plug PLG1B are provided with the same size in the same layer. For example, the barrier conductor film BCF is comprised of the tantalum nitride film TNF and the tantalum film TF provided on the tantalum nitride film TNF.

For example, as illustrated in FIG. 8, this embodiment is characterized in that the thickness of the barrier conductor film BCF provided on the bottom of the plug PLG1A to be coupled to the wide interconnection WL2 is larger than the thickness of the barrier conductor film BCF provided on the bottom of the plug PLG1B to be coupled to the narrow interconnection NL2. More in detail, the thickness of the tantalum nitride film TNF provided on the bottom of the plug PLG1A is larger than the thickness of the tantalum nitride film TNF provided on the bottom of the plug PLG1B, and the thickness of the tantalum nitride film TNF provided on the bottom of the plug PLG1A is large enough for the tantalum film TF provided on the tantalum nitride film TNF to have a crystal structure of the α-Ta structure. Specifically, the tantalum nitride film TNF, which is provided on the bottom of the plug PLG1A and to be coupled to the wide interconnection WL2, has a thickness of 5 to 10 nm. On the other hand, the tantalum nitride film TNF, which is provided on the bottom of the plug PLG1B and to be coupled to the narrow interconnection NL2, has a thickness of more than 0 nm and 3 nm or less. In this case, the tantalum film TF, which is provided on the tantalum nitride film TNF on the bottom of the plug PLG1A to be coupled to the wide interconnection WL2, has a crystal structure of the α-Ta structure having low resistivity. On the other hand, the tantalum film TF, which is provided on the tantalum nitride film TNF on the bottom of the plug PLG1B to be coupled to the narrow interconnection NL2, has a crystal structure of the β-Ta structure having high resistivity. In this embodiment, therefore, the resistivity of the tantalum film TF provided on the bottom of the plug PLG1A is lower than the resistivity of the tantalum film TF provided on the bottom of the plug PLG1B.

Figure 9:
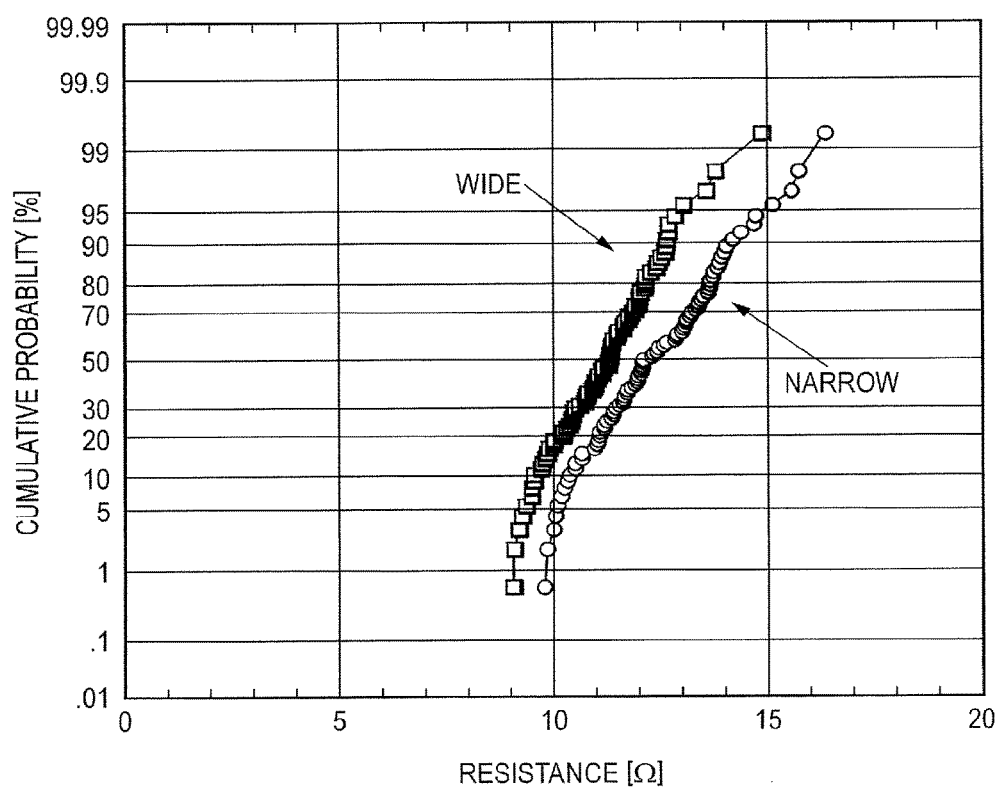
FIG. 9 includes graphs illustrating measurement results of plug resistance of a plug to be coupled to a wide interconnection and plug resistance of a plug to be coupled to a narrow interconnection in the embodiment.

Specifically, FIG. 9 includes graphs illustrating measurement results of the plug resistance of the plug PLG1A to be coupled to the wide interconnection WL2 and the plug resistance of the plug PLG1B to be coupled to the narrow interconnection NL2 in this embodiment. In FIG. 9, a graph designated as "Wide" shows the plug resistance of the plug PLG1A to be coupled to the wide interconnection WL2, and a graph designated as "Narrow" shows the plug resistance of the plug PLG1B to be coupled to the narrow interconnection NL2. As illustrated in FIG. 9, the plug resistance of the plug PLG1A to be coupled to the wide interconnection WL2 is lower than the plug resistance of the plug PLG1B to be coupled to the narrow interconnection NL2.

In this way, according to this embodiment, the resistance value (plug resistance) of the plug PLG1A to be coupled to the wide interconnection WL2 is allowed to be lower than the resistance value (plug resistance) of the plug PLG1B to be coupled to the narrow interconnection NL2. Hence, according to this embodiment, it is possible to suppress increase in plug resistance of the plug PLG1A to be coupled to the wide interconnection WL2 used as, for example, a power line, leading to improvement in performance of the semiconductor device.

In addition, according to this embodiment, it is possible to decrease the thickness of the barrier conductor film BCF provided on the inner wall of the interconnection trench WD2B; hence, it is possible to improve the filling properties for forming the narrow interconnection NL2 with a processing accuracy of about minimum working size.

Consequently, in this embodiment, for example, the following significant effect can be provided. That is, there is provided the semiconductor device having in the same layer the wide interconnection WL2 used as a power line that allows high current to pass therethrough and the narrow interconnection NL2 formed with the processing accuracy of about minimum working size, in which while the plug resistance of the plug PLG1A to be coupled to the wide interconnection WL2 is decreased, the filling properties for forming the narrow interconnection NL2 as a fine interconnection is improved.

<Method of Manufacturing Semiconductor Device>

The semiconductor device of this embodiment is configured as described above. A method of manufacturing the semiconductor device is now described with reference to drawings. The following manufacturing process is exemplarily described with a process in which the interconnection L1 is formed by the single damascene process in an interlayer insulating film provided above a semiconductor substrate, and then a multilayer interconnection structure is formed by the dual damascene process.

Figure 10:
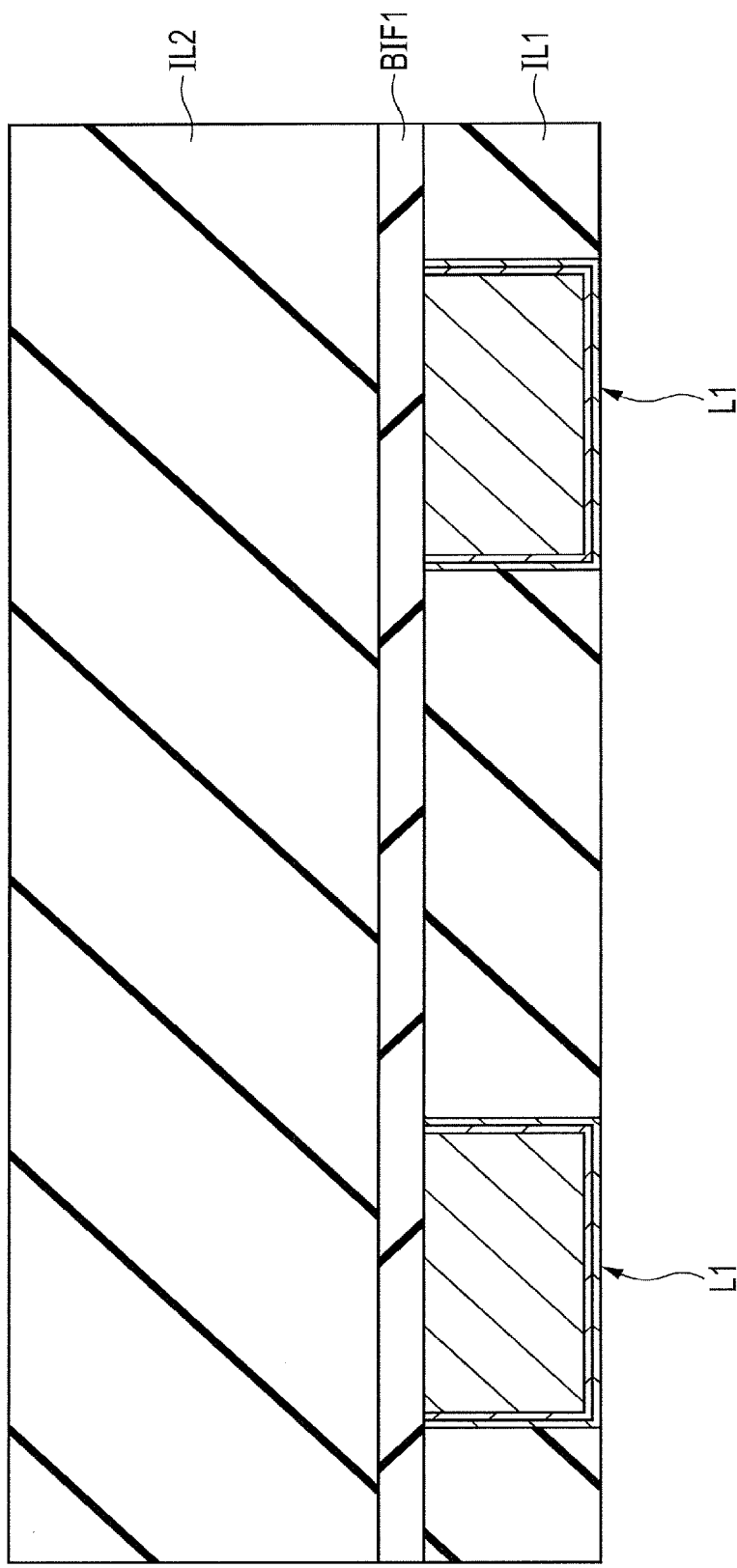
FIG. 10 is a section diagram illustrating a manufacturing step of a semiconductor device in the embodiment.

First, as illustrated in FIG. 10, the barrier insulating film B1F1 is formed on the interlayer insulating film IL1 having the interconnection L1 therein, and the interlayer insulating film IL2 is formed on the barrier insulating film B1F1. For example, the barrier insulating film B1F1 is comprised of one of a stacked film of a SiCN film and a SiCO film provided on the SiCN film, a SiC film, and a SiN film, and, for example, can be formed by a chemical vapor deposition (CVD) process. For example, the interlayer insulating film IL2 is comprised of a low-dielectric-constant film having a dielectric constant lower than that of a silicon oxide film. Specifically, for example, the interlayer insulating film IL2 can be comprised of a low-dielectric-constant film such as a SiOC film formed by the CVD process, or a HSQ or MSQ film formed by a coating process.

Figure 11:
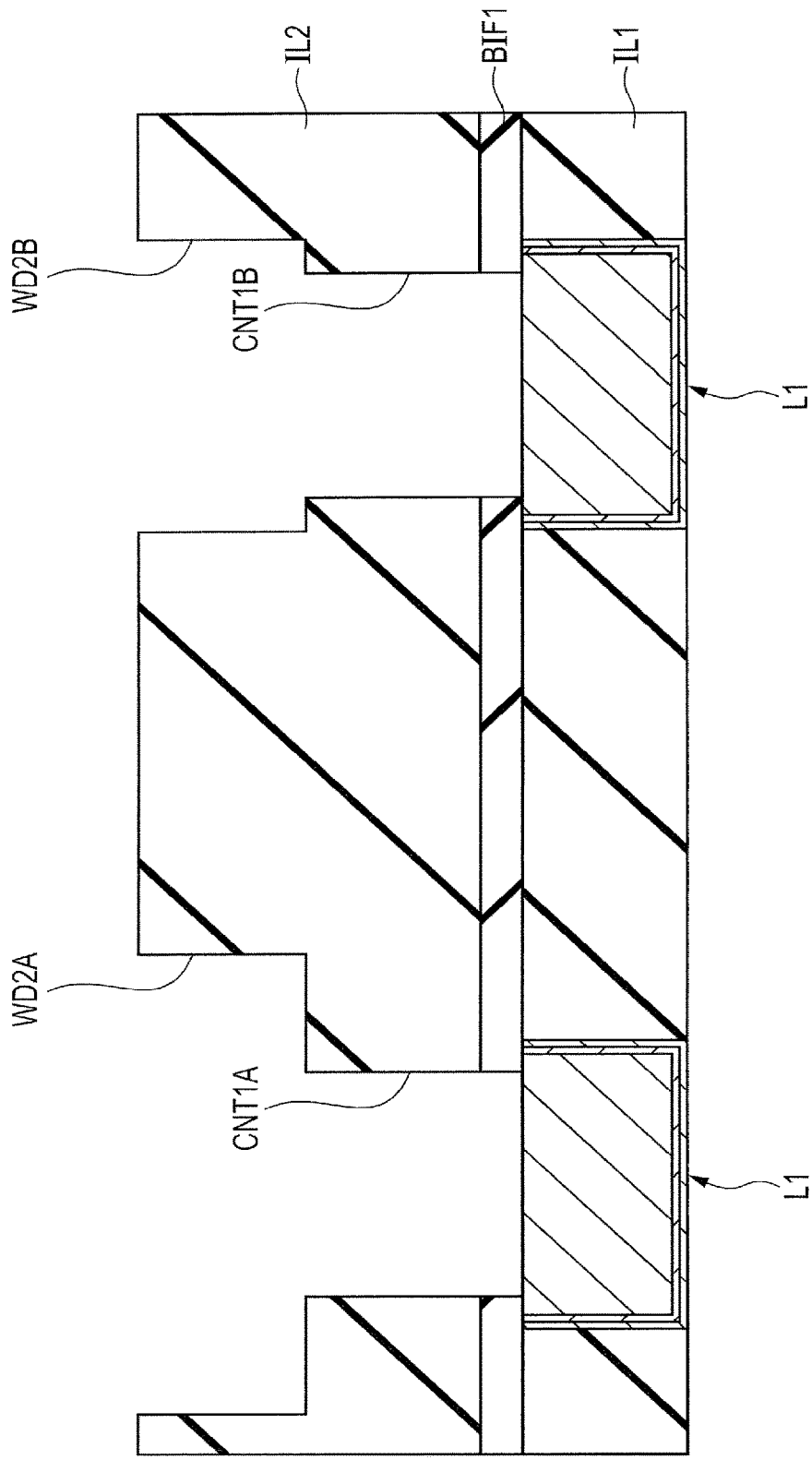
FIG. 11 is a section diagram illustrating a manufacturing step of the semiconductor device following FIG. 10.

Subsequently, as illustrated in FIG. 11, the interconnection trench WD2A integrated with the connection hole CNT1A and the interconnection trench WD2B integrated with the connection hole CNT1B are each formed so as to penetrate through the barrier insulating film B1F1 and the interlayer insulating film IL2 by using a photolithography technique and an etching technique. At this time, a surface of the interconnection L1 formed so as to be embedded in the interlayer insulating film IL1 is exposed at each of the bottoms of the connection hole CNT1A and the connection hole CNT1D. In this step, as illustrated in FIG. 11, width of the interconnection trench WD2A is made larger than width of the interconnection trench WD2B, and size of the connection hole CNT1A and size of the connection hole CNT1B are made equal to each other. In other words, the interconnection trench WD2B is formed with a dimension accuracy of, for example, about minimum working size, and the interconnection trench WD2A is formed with a dimension accuracy rougher than minimum working size, for example.

Figure 12:
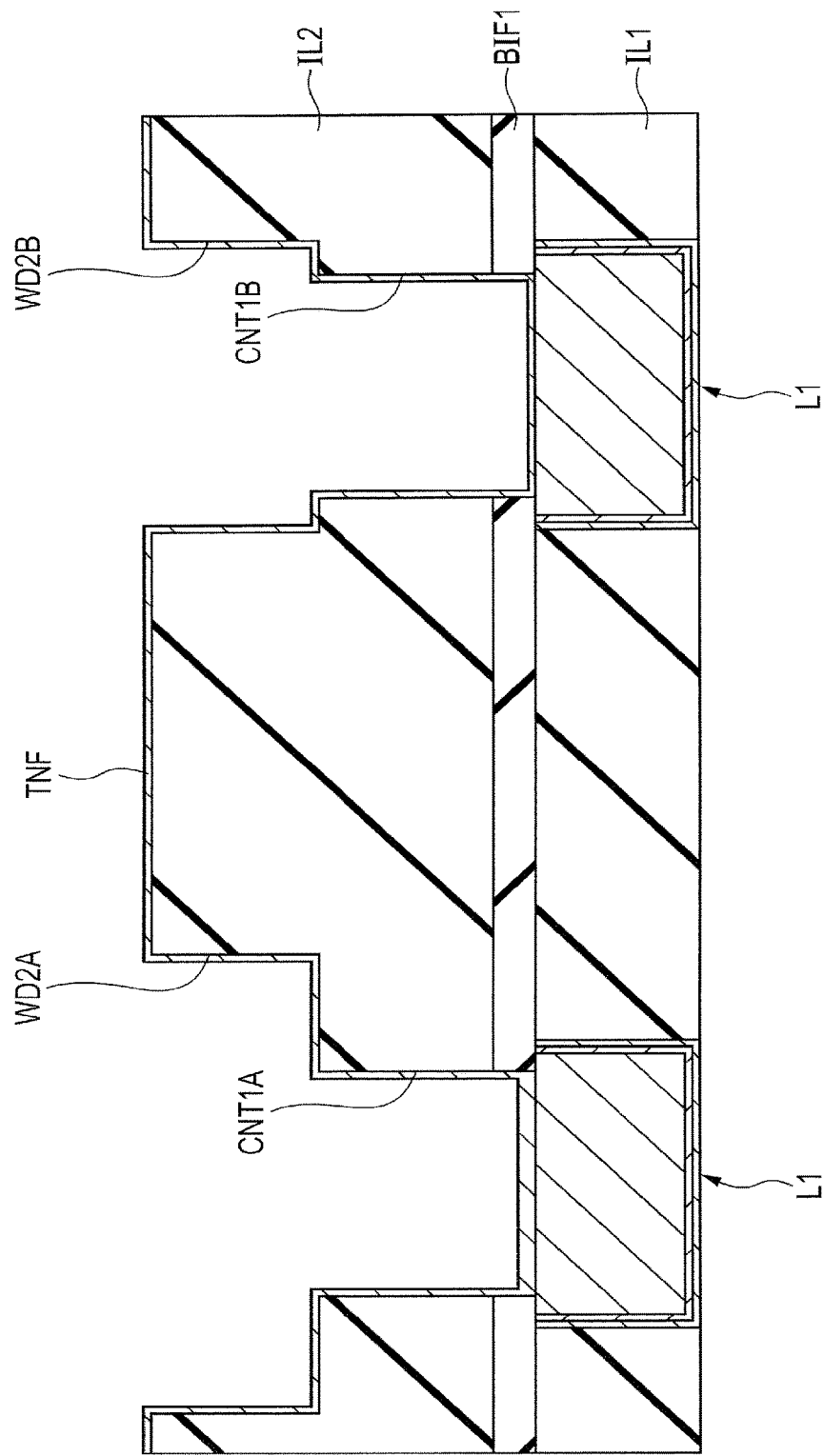
FIG. 12 is a section diagram illustrating a manufacturing step of the semiconductor device following FIG. 11.

Subsequently, as illustrated in FIG. 12, the tantalum nitride film TNF is formed over a region on the interlayer insulating film IL2 by, for example, a sputtering process, the region including each of the inner walls of the interconnection trench WD2A and the connection hole CNT1A and each of the inner walls of the interconnection trench WD2B and the connection hole CNT1B. At this time, as illustrated in FIG. 12, the thickness of the tantalum nitride film TNF formed on the bottom of the connection hole CNT1A is larger than the thickness of the tantalum nitride film TNF formed on the bottom of the connection hole CNT1B. Specifically, in this embodiment, a deposition condition in the sputtering process is devised such that the tantalum nitride film TNF is formed to have a thickness of 5 to 10 nm on the bottom of the connection hole CNT1A, and have a thickness of more than 0 nm and 3 nm or less on the bottom of the connection hole CNT1B. The deposition condition in the sputtering process for forming the tantalum nitride film TNF is described in detail later (first characteristic point in manufacturing).

Figure 13:
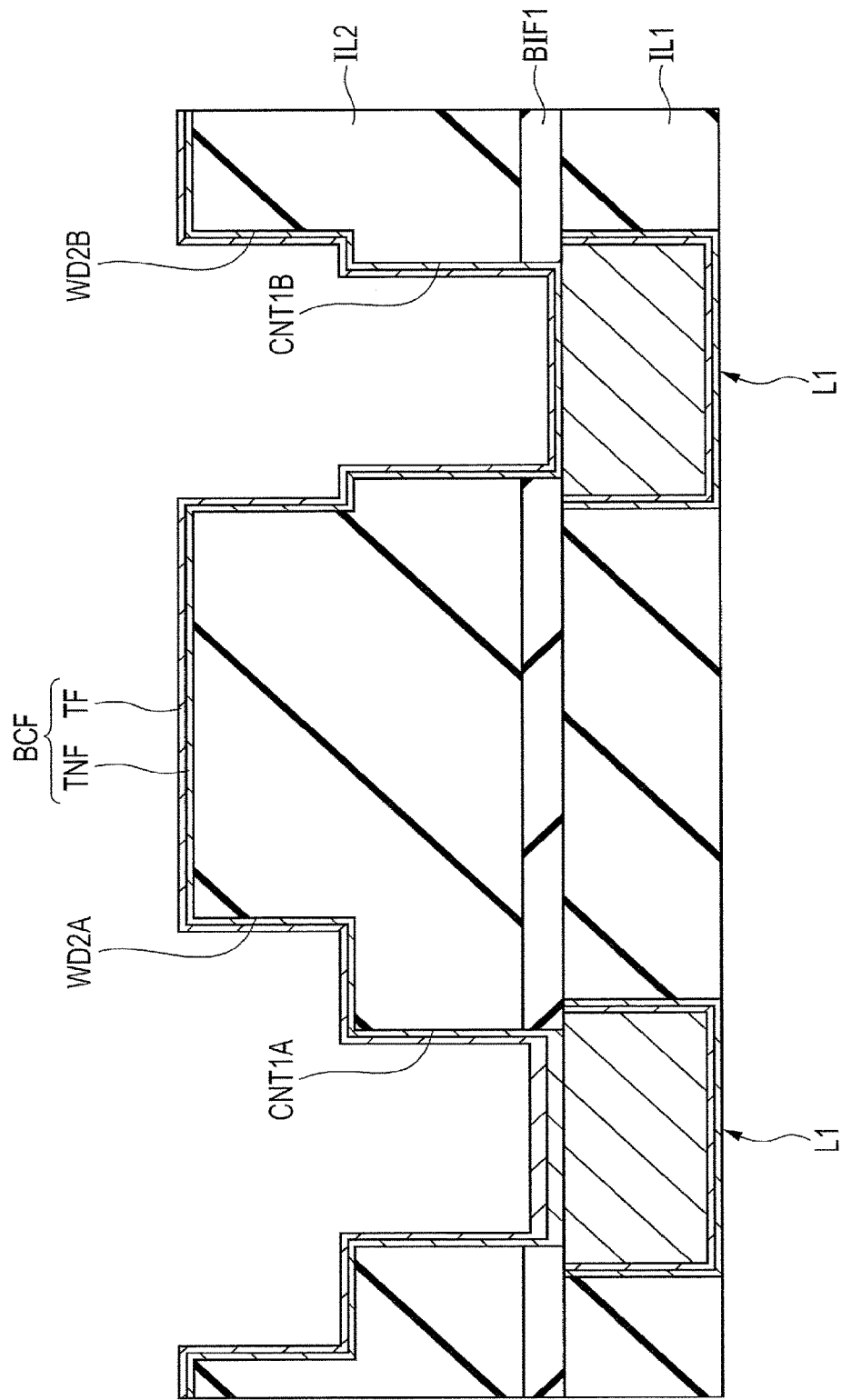
FIG. 13 is a section diagram illustrating a manufacturing step of the semiconductor device following FIG. 12.

Subsequently, as illustrated in FIG. 13, the tantalum film TF is formed on the tantalum nitride film TNF by using, for example, a sputtering process. At this time, since the tantalum nitride film TNF has a thickness of 5 to 10 nm on the bottom of the connection hole CNT1A, the tantalum film TF formed on such a tantalum nitride film TNF has a crystal structure of the $\alpha$-Ta structure having low resistivity. On the other hand, since the tantalum nitride film TNF has a thickness of more than 0 nm and 3 nm or less on the bottom of the connection hole CNT1B, the tantalum film TF formed on such a tantalum nitride film TNF has a crystal structure of the $\beta$-Ta structure having high resistivity. In this embodiment, there is also devised a technique on the deposition condition in the sputtering process for forming the tantalum film TF. According to the devised technique, in this embodiment, the tantalum film TF formed on the tantalum nitride film TNF tends to have a crystal structure of the $\alpha$-Ta structure. The deposition condition in the sputtering process for forming the tantalum film TF is described in detail later (second characteristic point in manufacturing)

In this way, the barrier conductor film BCF comprised of the tantalum nitride film TNF and the tantalum film TF can be formed over a region on the interlayer insulating film IL2, the region including each of the inner walls of the interconnection trench WD2A and the connection hole CNT1A and each of the inner walls of the interconnection trench WD2B and the connection hole CNT1B.

Figure 14:
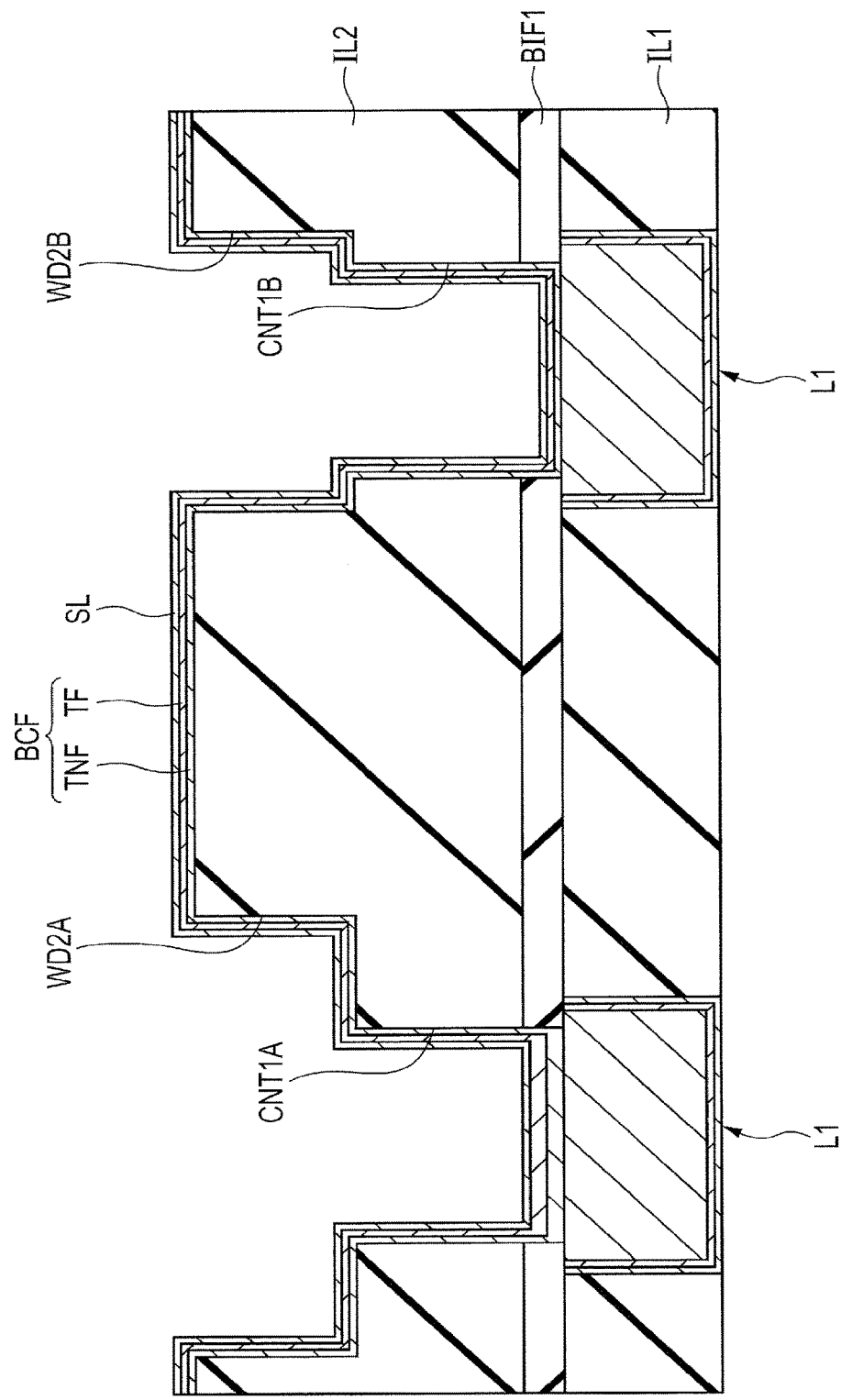
FIG. 14 is a section diagram illustrating a manufacturing step of the semiconductor device following FIG. 13.

Subsequently, as illustrated in FIG. 14, a seed film SL comprised of, for example, a thin copper film is formed over a region on the barrier conductor film BCF, the region including each of the insides of the interconnection trench WD2A and the connection hole CNT1A and each of the insides of the interconnection trench WD2B and the connection hole CNT1B. Although the seed film SL can be formed by, for example, a sputtering process, this is not limitative, and the seed film SL may be formed by, for example, a CVD process, an atomic layer deposition (ALD) process, or a plating process.

Figure 15:
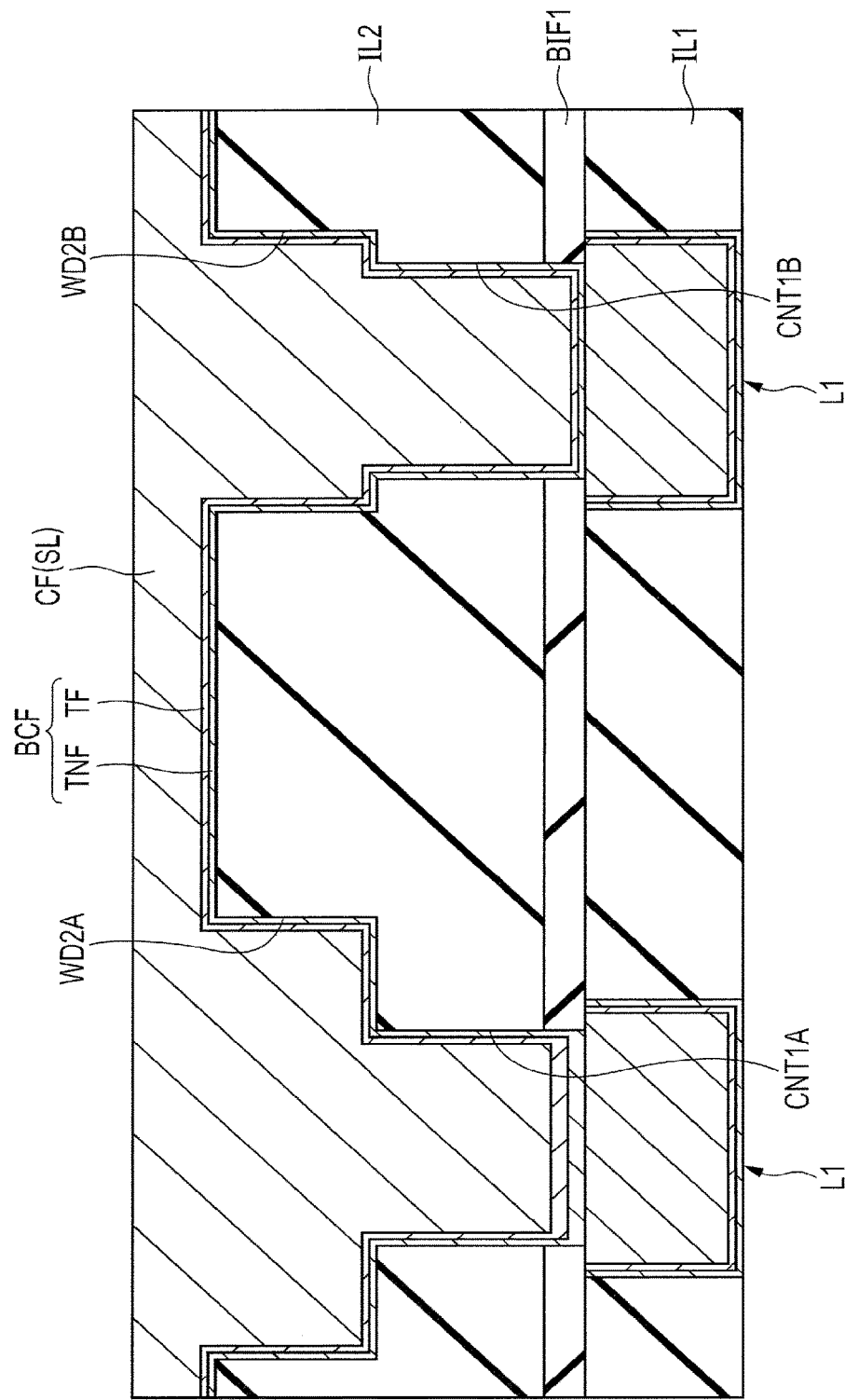
FIG. 15 is a section diagram illustrating a manufacturing step of the semiconductor device following FIG. 14.

Subsequently, as illustrated in FIG. 15, for example, the copper film CF is formed by an electrolytic plating process with the seed film SL as an electrode. The copper film CF is formed so as to fill each of the insides of the interconnection trench WD2A and the connection hole CNT1A and each of the insides of the interconnection trench WD2B and the connection hole CNT1B. At this time, in this embodiment, while the barrier conductor film BCF is formed on each of the inner walls of the interconnection trench WD2B and the connection hole CNT1B that are formed with the processing accuracy of about minimum working size, the barrier conductor film BCF still has a small thickness. It is therefore possible to improve filling properties when the interconnection trench WD2B is filled with the copper film CF.

The copper film CF is comprised of, for example, a film including copper as a main component. Specifically, the copper film CF is comprised of copper (Cu), or copper alloy (alloy of copper (Cu) and one of aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), indium (In), lanthanoid series metal, actinide series metal, and the like). The copper film CF may be formed not only by the electrolytic plating process but also by a sputtering process or a CVD process.

Subsequently, as illustrated in FIG. 8, the unnecessary barrier conductor film BCF and copper film CF formed on the interlayer insulating film IL2 are removed by a chemical mechanical polishing (CMP) process. On the other hand, the copper film CF and the barrier conductor film BCF are left in each of the insides of the interconnection trench WD2A and the connection hole CNT1A, and in each of the insides of the interconnection trench WD2B and the connection hole CNT1B. Consequently, according to this embodiment, as illustrated in FIG. 8, it is possible to form the wide interconnection WL2 including the barrier conductor film BCF and the copper film CF filling the interconnection trench WD2A, and form the plug PLG1A including the barrier conductor film BCF and the copper film CF filling the connection hole CNT1A. Similarly, according to this embodiment, it is possible to form the narrow interconnection NL2 including the barrier conductor film BCF and the copper film CF filling the interconnection trench WD2B, and form the plug PLG1B including the barrier conductor film BCF and the copper film CF filling the connection hole CNT1B. In this way, in this embodiment, the copper film CF included in the wide interconnection WL2 (first copper interconnection) and the copper film CF included in the plug PLG1A (first copper plug) are integrally provided, while the copper film CF included in the narrow interconnection NL2 (second copper interconnection) and the copper film CF included in the plug PLG1B (second copper plug) are integrally provided.

Subsequent steps are repeatedly performed in substantially the same way as the above-described steps, and duplicated description is omitted. In this way, the semiconductor device of this embodiment can be manufactured.

Characteristics in Manufacturing of Embodiment

The semiconductor device of this embodiment is manufactured using the method including the first characteristic point and the second characteristic point in manufacturing. This allows the plug resistance (resistance value) of the plug PLG1A to be lower than the plug resistance (resistance value) of the plug PLG1B. Specifically, the resistivity of the tantalum film TF provided on the bottom of the plug PLG1A is lower than the resistivity of the tantalum film TF provided on the bottom of the plug PLG1B. In detail, in this embodiment, the tantalum film TF provided on the bottom of the plug PLG1A has a crystal structure of the α-Ta structure having low resistivity, while the tantalum film TF provided on the bottom of the plug PLG1B has a crystal structure of the β-Ta structure having low resistivity. Hence, according to the manufacturing method of this embodiment, for example, it is possible to suppress increase in plug resistance of the plug PLG1A to be coupled to the wide interconnection WL2 used as a power line, leading to improvement in performance of the semiconductor device.

In addition, according to the method of manufacturing the semiconductor device of this embodiment, it is possible to decrease the thickness of the barrier conductor film BCF provided on the inner wall of the interconnection trench WD2B; hence, it is possible to improve the filling properties for forming the narrow interconnection NL2 with the processing accuracy of about minimum working size. Specifically, for example, the following significant effect can be provided by using the method of manufacturing the semiconductor device of this embodiment. That is, there is provided the semiconductor device having in the same layer the wide interconnection WL2 used as a power line that allows high current to pass therethrough and the narrow interconnection NL2 formed with the processing accuracy of about minimum working size, in which while the plug resistance of the plug PLG1A to be coupled to the wide interconnection WL2 is decreased, the filling properties for forming the narrow interconnection NL2 as a fine interconnection is improved.

The first characteristic point and the second characteristic point in manufacturing are now described. For example, the first characteristic point and the second characteristic point in manufacturing of this embodiment are achieved in the respective deposition steps of the tantalum nitride film and the tantalum film illustrated in FIGS. 12 and 13. Specifically, the first characteristic point and the second characteristic point in manufacturing of this embodiment are achieved in the step of forming the barrier conductor film BCE comprised of the tantalum nitride film TNF and the tantalum film TF over a region on the interlayer insulating film IL2, the region including each of the inner walls of the interconnection trench WD2A and the connection hole CNT1A and each of the inner walls of the interconnection trench WD2B and the connection hole CNT1B. Such steps are each a deposition step by a sputtering process, and the first characteristic point and the second characteristic point in manufacturing each relates to a deposition condition in the sputtering process.

Here, description is made on a configuration and brief deposition operation of a sputtering apparatus for performing the deposition steps in the sputtering process.

Figures 16, 17, 18:
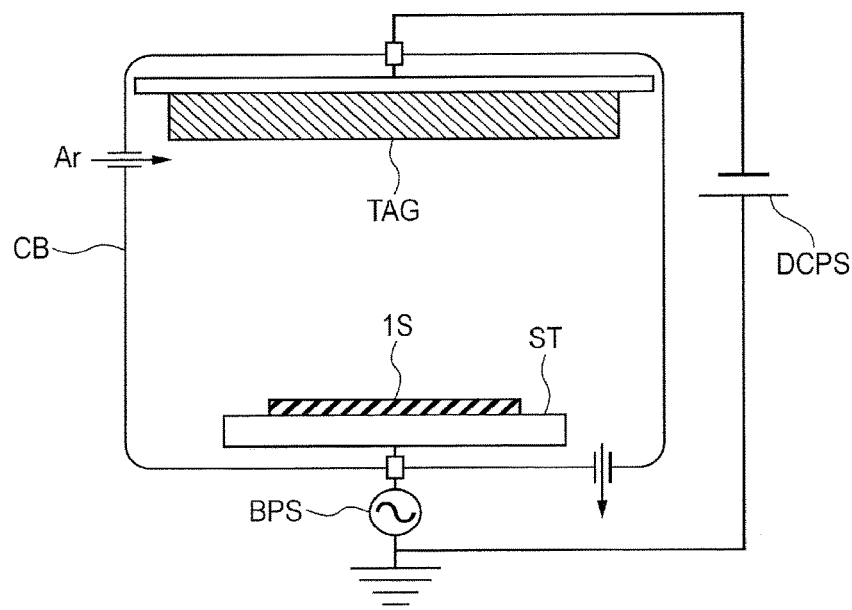
FIG. 16 is a diagram illustrating a configuration of a sputtering apparatus used in the embodiment.
FIG. 17 is a table showing a deposition condition in a deposition step of a tantalum nitride film.
FIG. 18 is a table showing a deposition condition in a deposition step of a tantalum film.

FIG. 16 is a diagram illustrating a configuration of a sputtering apparatus used in this embodiment. In FIG. 16, the sputtering apparatus has a processing chamber CB in which a stage ST is arranged, and the semiconductor substrate 1S is placed on the stage ST. In detail, an undepicted electrostatic chuck is provided in the stage ST so as to hold the semiconductor substrate 1S. An undepicted center tap is provided in the center of the electrostatic chuck. The center tap is configured to be directly in contact with the semiconductor substrate. The center tap is electrically coupled to a bias supply BPS by which a substrate draw bias is applied to the semiconductor substrate 1S.

In the processing chamber CB, a target TAG comprised of a deposition material is arranged at a position opposed to the semiconductor substrate 1S placed on the stage. The target TAG is electrically coupled to a DC power supply DCPS provided outside the processing chamber CB. In this configuration, power (target DC power) is supplied from the DC power supply DCPS to the target TAG. The inside of the processing chamber CB is to be filled with argon gas (Ar gas) introduced therein.

The sputtering apparatus used in this embodiment is configured as described above, and the deposition operation thereof is briefly described below. In FIG. 16, first, the semiconductor substrate 1S is arranged on the stage ST arranged in the processing chamber CB. Subsequently, argon gas (Ar gas) is introduced into the processing chamber CB, the target DC power is supplied from the DC power supply DCPS to the target TAG, and the substrate draw bias is applied from the bias supply BPS to the semiconductor substrate 1S. Plasma discharge then starts by a high electric field applied between the semiconductor substrate 1S and the target TAG. Consequently, the argon gas introduced into the processing chamber CB is ionized, and the high-energy argon ion accelerated by the high electric field collides with the target TAG. As a result, target atoms are emitted from the target TAG as a reaction of the collision of the argon ion to the target TAG, and the emitted target atoms adhere onto the semiconductor substrate 1S. This results in film formation on the semiconductor substrate 1S. This is the end of the deposition processing by the sputtering apparatus.

Specifically, in the method of manufacturing the semiconductor device of this embodiment, as illustrated in FIG. 12, the tantalum nitride film TNF is formed over a region on the interlayer insulating film IL2, the region including each of the inner walls of the interconnection trench WD2A and the connection hole CNT1A and each of the inner walls of the interconnection trench WD2B and the connection hole CNT1B by the sputtering process using the above-described sputtering apparatus. The deposition step of the tantalum nitride film is performed by the sputtering process with tantalum as the target TAG and with nitrogen gas introduced into the processing chamber CB. The first characteristic point in manufacturing of this embodiment is given in the deposition condition in this step.

FIG. 17 is a table showing the deposition condition in the deposition step of the tantalum nitride film. In FIG. 17, an existing condition in the deposition step of the tantalum nitride film is as follows: target DC power is 20 kW, power of substrate draw bias is 650 W, and deposition time is 4.6 sec. In contrast, the condition of this embodiment in the deposition step of the tantalum nitride film is as follows: target DC power is 20 kW, power of substrate draw bias is 650 W, and deposition time is 6.9 sec. This shows that the first characteristic point in manufacturing of this embodiment is in that the deposition time is increased from 4.6 sec to 6.9 sec. In other words, the first characteristic point in manufacturing of this embodiment is in that the deposition time is increased to increase the thickness of the tantalum nitride film. Specifically, in this embodiment, the deposition time is increased such that the thickness of the tantalum nitride film TNF provided on the bottom of the connection hole CNT1A illustrated in FIG. 12 is within a range from 5 to 10 nm. Specifically, in the case of the deposition time in the existing condition, the tantalum nitride film TNF provided on the bottom of the connection hole CNT1A has a thickness of less than 5 nm, and thereby the tantalum film TF provided on the tantalum nitride film TNF has a crystal structure of the β-Ta structure having high resistivity. In contrast, in the deposition condition of this embodiment, the deposition time is increased compared with the existing condition; hence, the tantalum nitride film TNF provided on the bottom of the connection hole CNT1A has a thickness of 5 to 10 nm. Consequently, according to this embodiment, the tantalum film TF provided on the tantalum nitride film TNF is allowed to have a crystal structure of the α-Ta structure. That is, in the case where the tantalum nitride film TNF provided on the bottom of the connection hole CNT1A has a thickness of 5 to 10 nm, the tantalum film TF provided on the tantalum nitride film TNF has a crystal structure of the α-Ta structure depending on the crystal structure of the tantalum nitride film TNF.

Increasing the deposition time in the deposition step of the tantalum nitride film TNF means that the thickness of the tantalum nitride film TNF provided on the bottom of the connection hole CNT1A is larger than that in the existing condition, and the thickness of the tantalum nitride film TNF provided on the bottom of the connection hole CNT1B is also increased. In this case, although the filling properties for forming the narrow interconnection NL2 are likely to be degraded, the thickness of the tantalum nitride film TNF provided on the bottom of the connection hole CNT1B is 3 nm or less even in the deposition condition of this embodiment; hence, influence on the filling properties for forming the narrow interconnection NL2 is likely to be small.

In this regard, it is intended to improve the filling properties for forming the narrow interconnection NL2. From such a viewpoint, for example, it is successful that while the deposition time in the deposition step of the tantalum nitride film TNF is successfully increased, the deposition time in the deposition step of the tantalum film TF provided on the tantalum nitride film TNF is decreased. That is, when the thickness of the tantalum film TF is decreased in correspondence to increase in thickness of the tantalum nitride film TNF, the thickness of the barrier conductor film BCF as the total thickness of the tantalum nitride film TNF and the tantalum film TF is not changed; hence, it is possible to suppress degradation in filling properties for forming the narrow interconnection NL2. Specifically, for example, when the tantalum nitride film TNF is formed to have a thickness larger by 1 nm, the deposition time in the deposition step of the tantalum film TF should be decreased such that the thickness of the tantalum film TF is decreased by 1 nm. In this case, the thickness of the tantalum film TF formed on the tantalum nitride film TNF is decreased not only on the bottom of the connection hole CNT1B and the inner wall of the interconnection trench WD2B, but also on the bottom of the connection hole CNT1A. Thus, the tantalum film TF has a crystal structure of the α-Ta structure having low resistivity. In addition, the thickness itself of the tantalum film TF is decreased. These two events synergistically decrease the plug resistance of the plug PLG1A to be coupled to the wide interconnection WL2. Specifically, it is intended to achieve, at a high level, both decrease in plug resistance of the plug PLG1A to be coupled to the wide interconnection WL2 and improvement in filling properties for forming the narrow interconnection NL2 as a fine interconnection. From such a viewpoint, it is desirable to increase the deposition time in the deposition step of the tantalum nitride film TNF, but decrease the deposition time in the deposition step of the tantalum film TF provided on the tantalum nitride film TNF.

In the method of manufacturing the semiconductor device of this embodiment, as illustrated in FIG. 13, the tantalum film TF is formed on the tantalum nitride film TNF by the sputtering process using the above-described sputtering apparatus, for example. The deposition step of the tantalum film is performed in such a manner that nitrogen gas is first exhausted, and then the tantalum film is formed by the sputtering process with tantalum as a target and with a substrate draw bias being applied to the semiconductor substrate. The second characteristic point in manufacturing of this embodiment is given in the deposition condition in this step.

FIG. 18 is a table showing the deposition condition in the deposition step of the tantalum film. In FIG. 18, an existing condition in the deposition step of the tantalum film is as follows: target DC power is 20 kW, power of substrate draw bias is 250 W, and electric potential of the semiconductor substrate is −255 V. In contrast, the condition of this embodiment in the deposition step of the tantalum film is as follows: target DC power is 20 kW, power of substrate draw bias is 400 W, and electric potential of the semiconductor substrate 1S is −350 V. This shows that the second characteristic point in manufacturing of this embodiment is in that the electric potential of the semiconductor substrate 1S is varied from −255 V to −350 V. In other words, the second characteristic point in manufacturing of this embodiment is in that the absolute value of the electric potential of the semiconductor substrate 1S is increased compared with that in the existing condition. Consequently, according to this embodiment, the tantalum film TF provided on the tantalum nitride film TNF is allowed to easily have a crystal structure of the α-Ta structure. For example, increasing the absolute value of the electric potential of the semiconductor substrate 1S means that tantalum atoms emitted from the target TAG are accelerated and adhere onto the tantalum nitride film TNF. In this case, since the tantalum atoms each have a large kinetic energy, even after the tantalum atoms adhere onto the tantalum nitride film TNF, each tantalum atom easily moves so as to reflect the crystal structure of the tantalum nitride film. As a result, according to this embodiment, the tantalum film TF provided on the tantalum nitride film TNF easily has a crystal structure of the α-Ta structure having low resistivity.

Thus, it is intended to make the tantalum film TF provided on the tantalum nitride film TNF to have a crystal structure of the α-Ta structure having low resistivity. From such a viewpoint, it is desirable to increase the absolute value of the electric potential of the semiconductor substrate 1S. For example, it is desirable to apply a substrate draw bias such that the electric potential of the semiconductor substrate 1S is within a range from −350 V to −800 V. For example, such a condition can be given by applying the substrate draw bias to the semiconductor substrate is at a power of 400 to 1000 W. The electric potential of the semiconductor substrate 1S is thus adjusted to be within the range from −350 V to −800 V by applying the substrate draw bias at a certain power. The power however is considered to vary depending on types of the sputtering apparatus. In any type of sputtering apparatus, therefore, power for applying the substrate draw bias should be supplied such that the electric potential of the semiconductor substrate 18 is finally within a range from −350 V to −800 V.

Consequently, according to the method of manufacturing the semiconductor device of this embodiment, a synergetic effect of the first and second characteristic points in manufacturing is provided, and thereby it is possible to achieve both decrease in plug resistance of the plug PLG1A to be coupled to the wide interconnection WL2, and improvement in filling properties for forming the narrow interconnection NL2 as a fine interconnection. It is thus intended to achieve both decrease in plug resistance of the plug PLG1A to be coupled to the wide interconnection WL2, and improvement in filling properties for forming the narrow interconnection NL2 as a fine interconnection. From such a viewpoint, it is desirable to combine the first characteristic point in manufacturing with the second characteristic point in manufacturing. This however is not limitative. For example, it is acceptable to use a configuration where only the first characteristic point in manufacturing is performed or a configuration where only the second characteristic point in manufacturing is performed. Specifically, the first characteristic point in manufacturing relates to the deposition step of the tantalum nitride film, while the second characteristic point in manufacturing relates to the deposition step of the tantalum film; hence, the first and second characteristic points can be performed independently of each other.

<Modification>

A modification of this embodiment is now described. This modification is based on the following technical idea. That is, in the deposition step of the tantalum nitride film TNF illustrated in FIG. 12, introduction timing of nitrogen gas to be introduced into the processing chamber CB of the sputtering apparatus is advanced compared with that in the existing technique.

Figure 19:
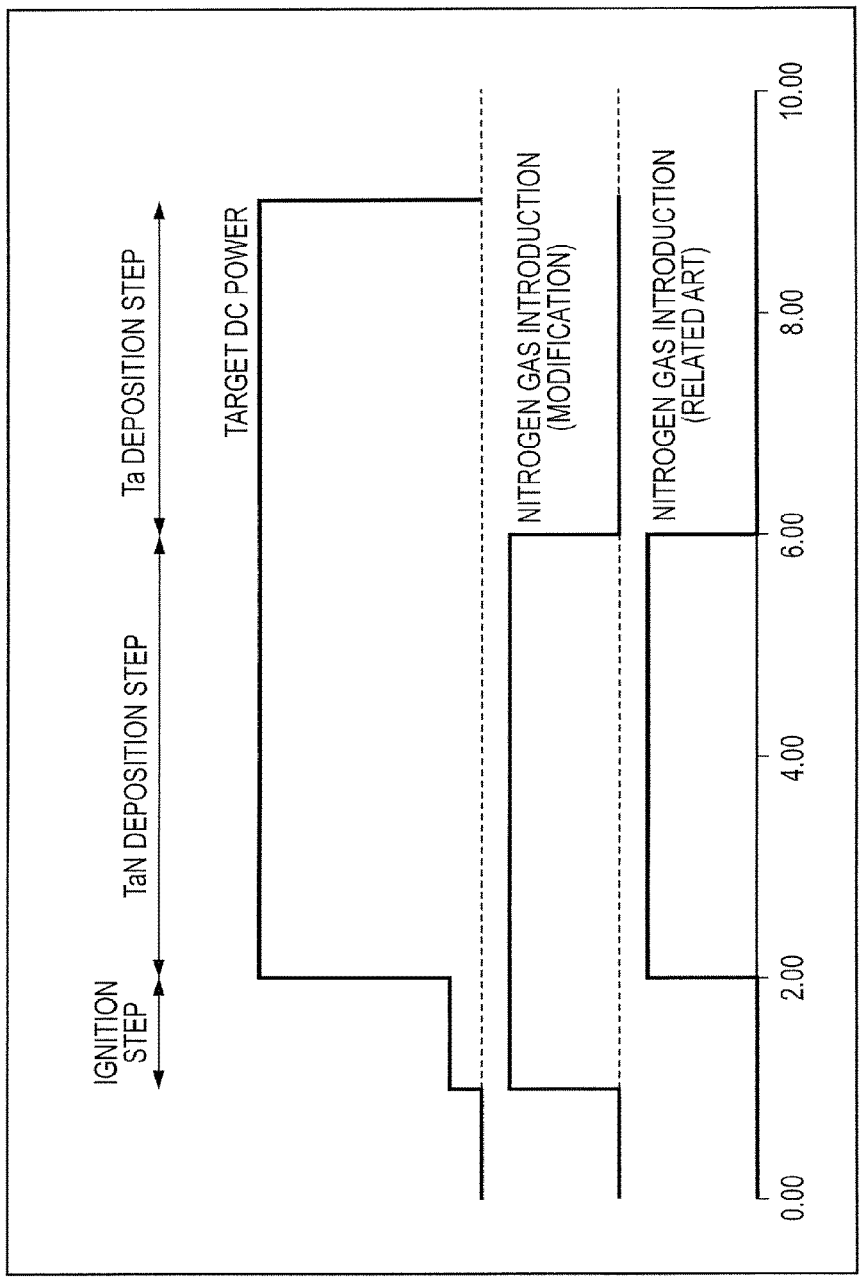
FIG. 19 is a diagram for explaining introduction timing of nitrogen gas in a deposition step of a tantalum nitride film in a modification.

FIG. 19 is a diagram for explaining introduction timing of nitrogen gas in the deposition step of the tantalum nitride film TNF in this modification. In FIG. 19, in the sputtering apparatus, an ignition step of starting plasma discharge of argon gas is first performed, and then the deposition step (TaN deposition step) of the tantalum nitride film TNF is performed, and then the deposition step (Ta deposition step) of the tantalum film TF is sequentially performed. At this time, as illustrated in FIG. 19, target DC power is stepwise increased in the ignition step, and therethrough plasma discharge is started. The target DC power is then maintained to a fixed value over the TaN deposition step and the Ta deposition step. In an existing technique in FIG. 19, nitrogen gas is introduced after the ignition step is finished. Actually, sputtering occurs in the process of stepwise increasing the target DC power in the ignition step. Hence, in the existing technique, the tantalum film is formed in the stage of the ignition step, and formation of the tantalum nitride film begins upon introduction of nitrogen gas in the subsequent TaN deposition step. In contrast, in this modification, as illustrated in FIG. 19, nitrogen gas is introduced into the processing chamber CB in a stage of starting the ignition step (a step before the TaN deposition step). Consequently, according to this modification, the tantalum nitride film can be formed over the ignition step to the TaN deposition step. That is, in this modification, since nitrogen gas is introduced into the processing chamber CB in the stage of starting the ignition step, the tantalum nitride film can also be formed in the stage of the ignition step. As a result, according to this modification, even if deposition time in the TaN deposition step is not increased, deposition time of the tantalum nitride film TNF can be substantially increased, and thereby the first characteristic point in manufacturing can be provided. Hence, according to this modification, the tantalum nitride film TNF provided on the bottom of the connection hole CNT1A is allowed to have a thickness of 5 to 10 nm without reducing throughput of the sputtering apparatus. Consequently, according to this modification, the tantalum film TF provided on the tantalum nitride film TNF is allowed to have a crystal structure of the α-Ta structure.

Effects of Embodiment

According to this embodiment (including the modification), for example, the following effects can be provided.

(1) According to this embodiment, for example, the following significant effect can be provided. That is, there is provided the semiconductor device having in the same layer the wide interconnection WL2 used as a power line that allows high current to pass therethrough and the narrow interconnection NL2 formed with the processing accuracy of about minimum working size, in which while the plug resistance of the plug PLG1A to be coupled to the wide interconnection WL2 is decreased, the filling properties for forming the narrow interconnection NL2 as a fine interconnection is improved.

(2) According to this embodiment, for example, the respective tantalum nitride films TNF having different thicknesses can be formed in one sputtering step on the respective bottoms of the plugs (PLG1A and PLG1B) to be coupled to the wide interconnection WL2 and the narrow interconnection NL2 that have different line widths and are provided in the same interconnection layer. According to this embodiment, therefore, the tantalum nitride film provided on the bottom of the plug PLG1A to be coupled to the wide interconnection WL2 and the tantalum nitride film provided on the bottom of the plug PLG1B to be coupled to the narrow interconnection NL2 are not necessary to be formed in separate sputtering steps; hence, the sputtering process for forming the tantalum nitride films having different thicknesses can be simplified, and thereby manufacturing cost of the semiconductor device can be reduced.

Although the invention achieved by the inventors has been described in detail according to one embodiment thereof hereinbefore, the invention should not be limited thereto, and it will be appreciated that various modifications or alterations thereof may be made within the scope without departing from the spirit of the invention.

What is claimed is:

1. A method of manufacturing a semiconductor device, comprising the steps of:
   (a) forming an interlayer insulating film above a semiconductor substrate;
   (b) forming, in the interlayer insulating film, a first interconnection trench integrated with a first connection hole and a second interconnection trench integrated with a second connection hole;
   (c) forming a barrier conductor film comprised of a stacked film of a tantalum nitride film and a tantalum film over a region on the interlayer insulating film, the region including each of inner walls of the first interconnection trench and the first connection hole and each of inner walls of the second interconnection trench and the second connection hole; and
   (d) after the step (c), forming a copper film over the barrier conductor film so as to fill the first interconnection trench and the first connection hole, and fill the second interconnection trench and the second connection hole; and
   (e) after the step (d), while removing the copper film and the barrier conductor film formed over the interlayer insulating film, leaving the copper film and the barrier conductor film in each of insides of the first interconnection trench and the first connection hole, and leaving the copper film and the barrier conductor film in each of insides of the second interconnection trench and the second connection hole, the step (b) being performed such that width of the first interconnection trench is larger than width of the second interconnection trench, and size of the first connection hole is equal to size of the second connection hole, the step (c) including the steps of:

(c1) arranging the semiconductor substrate on a stage arranged in a processing chamber; and (c2) after the step (c1), starting plasma discharge in the processing chamber; and (c3) after the step (c2), forming the tantalum nitride film over a region on the interlayer insulating film, the region including each of inner walls of the first interconnection trench and the first connection hole and each of inner walls of the second interconnection trench and the second connection hole, by a sputtering process with tantalum as a target and with nitrogen gas introduced into the processing chamber; and (c4) after exhausting the nitrogen gas, forming the tantalum film over the tantalum nitride film by a sputtering process with tantalum as a target and with a substrate draw bias being applied to the semiconductor substrate, the step (e) allowing formation of:

a first copper interconnection including the barrier conductor film and the copper film filling the first interconnection trench;

a first copper plug including the barrier conductor film and the copper film filling the first connection hole;

a second copper interconnection including the barrier conductor film and the copper film filling the second interconnection trench; and a second copper plug including the barrier conductor film and the copper film filling the second connection hole, wherein deposition time for performing the step (c3) is within a range in which the tantalum nitride film formed on the bottom of the first connection hole has a thickness of 5 to 10 nm.

2. The method according to claim 1, wherein the tantalum nitride film formed on the bottom of the second connection hole during the deposition time for performing the step (c3) has a thickness of more than 0 nm and 3 nm or less.

3. The method according to claim 1, wherein the nitrogen gas is introduced into the processing chamber in a step prior to the step (c3).

4. The method according to claim 3, wherein the nitrogen gas is introduced into the processing chamber in the step (c2).

5. The method according to claim 1, wherein in the step (c4), the substrate draw bias is applied such that electric potential of the semiconductor substrate is within a range from −350 V to −800 V.

6. The method according to claim 1, wherein in the step (c4), the substrate draw bias is applied to the semiconductor substrate at a power of 400 to 1000 W.

7. The method according to claim 1, wherein a resistance value of the first copper plug is lower than a resistance value of the second copper plug.

8. The method according to claim 1, wherein resistivity of the tantalum film formed on a bottom of the first copper plug is lower than resistivity of the tantalum film formed on a bottom of the second copper plug.

9. The method according to claim 8, wherein the tantalum film formed on the bottom of the first copper plug has a crystal structure of a α-Ta structure, and the tantalum film formed on the bottom of the second copper plug has a crystal structure of a β-Ta structure.

10. The method according to claim 1, wherein first thickness of the tantalum nitride film provided on a bottom of the first copper plug is larger than second thickness of the tantalum nitride film provided on a bottom of the second copper plug.

11. A method of manufacturing a semiconductor device, comprising the steps of:

(a) forming an interlayer insulating film above a semiconductor substrate;

(b) forming, in the interlayer insulating film, a first interconnection trench integrated with a first connection hole and a second interconnection trench integrated with a second connection hole;

(c) forming a barrier conductor film comprised of a stacked film of a tantalum nitride film and a tantalum film over a region on the interlayer insulating film, the region including each of inner walls of the first interconnection trench and the first connection hole and each of inner walls of the second interconnection trench and the second connection hole; and (d) after the step (c), forming a copper film over the barrier conductor film so as to fill the first interconnection trench and the first connection hole, and fill the second interconnection trench and the second connection hole; and (e) after the step (d), while removing the copper film and the barrier conductor film provided over the interlayer insulating film, leaving the copper film and the barrier conductor film in each of insides of the first interconnection trench and the first connection hole, and leaving the copper film and the barrier conductor film in each of insides of the second interconnection trench and the second connection hole, the step (b) being performed such that width of the first interconnection trench is larger than width of the second interconnection trench, and size of the first connection hole is equal to size of the second connection hole, the step (c) including the steps of:

(c1) arranging the semiconductor substrate on a stage arranged in a processing chamber; and (c2) after the step (c1), starting plasma discharge in the processing chamber; and (c3) after the step (c2), forming the tantalum nitride film over a region on the interlayer insulating film, the region including each of inner walls of the first interconnection trench and the first connection hole and each of inner walls of the second interconnection trench and the second connection hole by a sputtering process with tantalum as a target and with nitrogen gas introduced into the processing chamber; and (c4) after exhausting the nitrogen gas, forming the tantalum film over the tantalum nitride film by a sputtering process with tantalum as a target and with a substrate draw bias being applied to the semiconductor substrate, the step (e) allowing formation of:

a first copper interconnection including the barrier conductor film and the copper film filling the first interconnection trench;

a first copper plug including the barrier conductor film and the copper film filling the first connection hole;

a second copper interconnection including the barrier conductor film and the copper film filling the second interconnection trench; and a second copper plug including the barrier conductor film and the copper film filling the second connection hole, wherein, in the step (c4), the substrate draw bias is applied such that electric potential of the semiconductor substrate is within a range from −350 V to −800 V.

12. The method according to claim 11, wherein power of the substrate draw bias applied in the step (c4) is 400 to 1000 W.

13. The method according to claim 11, wherein first thickness of the tantalum nitride film provided on a bottom of the first copper plug is larger than second thickness of the tantalum nitride film provided on a bottom of the second copper plug.

* * * * *